United States Patent [19]

Alexander et al.

[11] Patent Number: 5,272,664
[45] Date of Patent: Dec. 21, 1993

[54] HIGH MEMORY CAPACITY DRAM SIMM

[75] Inventors: David Alexander, Mountain View; Michael E. Anderson, Sunnyvale; Richard G. Bahr, Menlo Park; Martin M. Deneroff, Palo Alto; Kumar Venkatasubramaniam, San Jose, all of Calif.

[73] Assignee: Silicon Graphics, Inc., Mountain View, Calif.

[21] Appl. No.: 49,803

[22] Filed: Apr. 21, 1993

[51] Int. Cl.[5] .................................................. G11C 5/04
[52] U.S. Cl. ........................................ 365/52; 365/63; 365/230.03; 361/760
[58] Field of Search .............. 365/52, 63, 230.03, 365/233; 361/397, 400, 413

[56] References Cited

U.S. PATENT DOCUMENTS

| | | | |
|---|---|---|---|
| 4,656,605 | 4/1987 | Clayton | 365/52 |
| 4,727,513 | 2/1988 | Clayton | 365/52 |
| 4,882,700 | 11/1989 | Mauritz et al. | 365/51 |
| 4,891,789 | 1/1990 | Quattrini et al. | 365/63 |
| 5,070,450 | 12/1991 | Holman, Jr. et al. | 395/750 |
| 5,089,993 | 2/1992 | Neal et al. | 365/52 X |
| 5,126,910 | 6/1992 | Windsor et al. | 361/42 |
| 5,157,635 | 10/1992 | Ellis et al. | 365/230.06 |
| 5,164,916 | 11/1992 | Wu et al. | 365/52 |
| 5,191,657 | 3/1993 | Ludwig et al. | 395/325 |
| 5,228,132 | 7/1993 | Neal et al. | 365/233 |

OTHER PUBLICATIONS

Parity Systems Inc. 200-pin SPARC 10 Series SIMM Printed Circuit Board, Feb. 1993.
Silicon Graphics Enhancements Products catalog (Kingston Technology Corp., 17600 Newhope Street, Fountain Valley, CA 92708; Mar. 1993).
Sun Memory catalog (Kingston Technology Corp., 17600 Newhope Street, Fountain Valley, CA 92708; Apr. 1993).

Primary Examiner—Joseph A. Popek
Attorney, Agent, or Firm—Sterne, Kessler, Goldstein & Fox

[57] ABSTRACT

A dynamic random access memory (DRAM) single in-line memory module (SIMM) having optimized physical dimensions achieves high speed and high storage capacity. The DRAM SIMM has a printed circuit board with a multi-contact connector, a plurality of DRAM sets, each set having a plurality of DRAM chips mounted on the printed circuit board, and a plurality of buffers which are also mounted on the printed circuit board. The number of buffers is equal to the number of DRAM sets. Various standard DRAM chips can be used on the SIMM to achieve different performance and storage capacity, while maintaining plug compatibility of the multi-contact connector with a memory board. The buffers buffer the control and address signals for the DRAM chips, which is necessary to keep control and address signal integrity due to the number of DRAMS. The buffers permit each DRAM to receive the necessary control and address signals in a more synchronized fashion, so that relative delays are well controlled. The multi-contact connector has a first group of pins for receiving control and address signals, a second group of pins for data input/output signals, a third group of pins for indicating the type code of the SIMM, and a fourth group of pins for power and ground connections.

47 Claims, 13 Drawing Sheets

HIGH MEMORY CAPACITY DRAM SIMM

BACKGROUND OF THE INVENTION

1. Field of the Invention

The present invention relates generally to the field of computer memory, and more particularly, to a dynamic random access memory single in-line memory module.

2. Related Art

The following two text books provide discussions of memory requirements for computers: John L. Hennessy et al., "Computer Architecture-A Quantitative Approach", (Morgan Kaufmann Publishers, Inc., San Mateo, Calif., 1990); and Stephen B. Furber, "VLSI RISC Architecture and Organization", (Marcel Dekker, Inc., New York, N.Y., 1989), which are incorporated herein by reference. The following paragraphs include a summary from these text books concerning the state-of-the-art related to the present invention.

Memory latency is typically described using two measures: access time and cycle time. "Access time" is the time between when a read is requested and when the desired data arrives, while "cycle time" is the minimum time between requests to memory.

Using faster memory devices is the obvious way to improve not only memory, but memory bandwidth as well. Memory bandwidth is defined as how fast information can be supplied once the flow has started; it is the product of the rate of data transfer and the amount of data in each transfer, and is usually expressed in millions of bytes per second (Mbytes/s). Unfortunately, using faster memory has a direct impact on cost; the faster parts cost more. In the past, this cost was acceptable in certain supercomputers, but other classes of machines were constrained to use economical bulk memory technology. In most cases, this currently means using Dynamic Random Access Memory (DRAM) devices.

DRAMs are implemented in a way that exposes their internal structure, which is typically a near-square array of bits. A particular bit is specified by its row and column in the array. In the 1970s, as DRAMs grew in capacity, the cost of a package with all the necessary address lines became an issue. The solution was to multiplex the address lines, thereby cutting the number of address pins in half. The top half of the address comes first, during the "row-access strobe", or RAS. This operation is followed by the second half of the address during the "column-access strobe", or CAS. These names come from the internal chip organization, for memory is organized as a rectangular matrix addressed by rows and columns.

An additional requirement of DRAMs derives from the property signified by its first letter D for "dynamic." A "refresh" operation is required with DRAMs in order to maintain the information stored at each memory location due to the circuitry used. Refresh is done periodically by writing back data after it is read. Because of this refresh operation, every DRAM must have every row accessed within a certain time window, such as 2 milliseconds, or the information in the DRAM may be lost. This requirement means that the memory system is occasionally unavailable because it is sending a signal telling every chip to refresh. The time cost of a refresh is typically a full memory access (RAS and CAS) for each row of the DRAM. Since the memory matrix in a DRAM is likely to be square, the number of steps in a refresh is usually the square root of the DRAM capacity. The cycle time for DRAMs is therefore the access time plus the refresh time.

DRAM access times are divided into row access and column access. During each row access a DRAM will usually store one or more column bit locations in that row. This row is usually the square root of the DRAM size (e.g., 1024 bits for 1 Mbit, 2048 for 4 Mbits, and so on). DRAMs also come with optional timing signals that allow repeated column accesses to the memory after a single row-access time. These timing signals allow for information to be read out of a DRAM in one of several optimal ways that can optimize data retrieval.

There are three data retrieval optimization modes: nibble mode, page mode and static column mode. In "nibble mode", the DRAM can supply three extra bits from sequential locations for every row access. Contrastingly, by changing column address in "page mode", multiple random bits can be accessed in the buffer until the next row access or refresh time. "Static column mode" is very similar to page mode, except that it is not necessary to hit the column-access strobe line every time the column address changes. The static column mode has been given the acronym SCRAM, for static column DRAM.

Starting with conventional 1-Mbit DRAMS, most chips can perform any of the three modes. The desired optimization mode is selected at the time the chip is packaged by choosing which pads to wire-up as specified by the manufacturer. These modes change the definition of cycle time for DRAMS.

The advantage of these optimization modes is that they use the circuitry already on the DRAMS, adding little cost to the system while achieving almost a four-fold improvement in bandwidth. For example, nibble mode was designed to take advantage of the same program behavior as interleaved memory. The chip reads four bits at a time internally, supplying four bits externally in the time of four optimized cycles. Unless the bus transfer time is faster than the optimized cycle time, the cost of four-way interleaved memory is only more complicated timing control. Page mode and static column mode are also used to get even higher interleaving with slightly more complex control.

Thus, it is expected that most main memory systems in the future will use such optimization techniques to reduce the CPU-DRAM performance gap. Unlike traditional interleaved memories, there are no disadvantages using these DRAM modes as DRAMs scale upward in capacity, nor is there the problem of the minimum expansion increment in main memory.

Presently, main memory is expanded by adding DRAMs mounted on "single in-line memory modules" (SIMM). SIMMs are available off-the-shelf for most personal computers, workstations, and the like. Typically, these systems have main memory requirements in the range of 1–32 Mbytes. However, shared main memory multiprocessing systems have much greater main memory requirements.

What is desired is a faster, still higher memory capacity and more physically compact SIMM to meet present and future computer requirements.

SUMMARY OF THE INVENTION

The present invention is a DRAM SIMM which operates in conjunction with a memory board to overcome the memory speed, storage density, and size limitations of conventional devices by providing enhanced on-SIMM buffering of control and address signals and high capacity storage of wide data words within an optimal size SIMM.

A preferred embodiment for the physical size of the SIMM produces the optimal physical relationships between the SIMM, the memory boards and the components on each SIMM. Storage capacity can therefore be maximized because of this physical optimization. Because of these optimal physical relationships, only two column accesses are necessary to access sufficient data per row access to meet high memory board bandwidth requirements.

The SIMM has a printed circuit board with a multi-pin/pad single in-line connector that provides control and address signals, data input/output signals, a type coding, and power and ground. The SIMM includes a plurality of DRAM sets, each set having a plurality of DRAM chips, and a plurality of buffers, where the number of buffers is equal to the number of DRAM sets. Each DRAM chip receives the control and address signals that have been buffered by the buffers. Plural buffers virtually eliminate signal skew and keep signal delays well controlled, compensate for the capacitance on the address and control lines, and produce increases in the speed of addressing and control. Each DRAM receives data input signals and transmits data output signals. The SIMM provides type coding signals which indicate to the memory board the type of SIMM. The SIMM allows the user to configure the memory to meet storage and performance requirements.

BRIEF DESCRIPTION OF THE FIGURES

The invention will be better understood if reference is made to the accompanying drawings in which.

In the drawings, like reference numbers indicate identical or functionally similar elements. Additionally, the left-most digit of the reference number identifies the drawing in which the reference number first appears.

DETAILED DESCRIPTION OF THE PREFERRED EMBODIMENTS

Table of Contents

Figure 1:
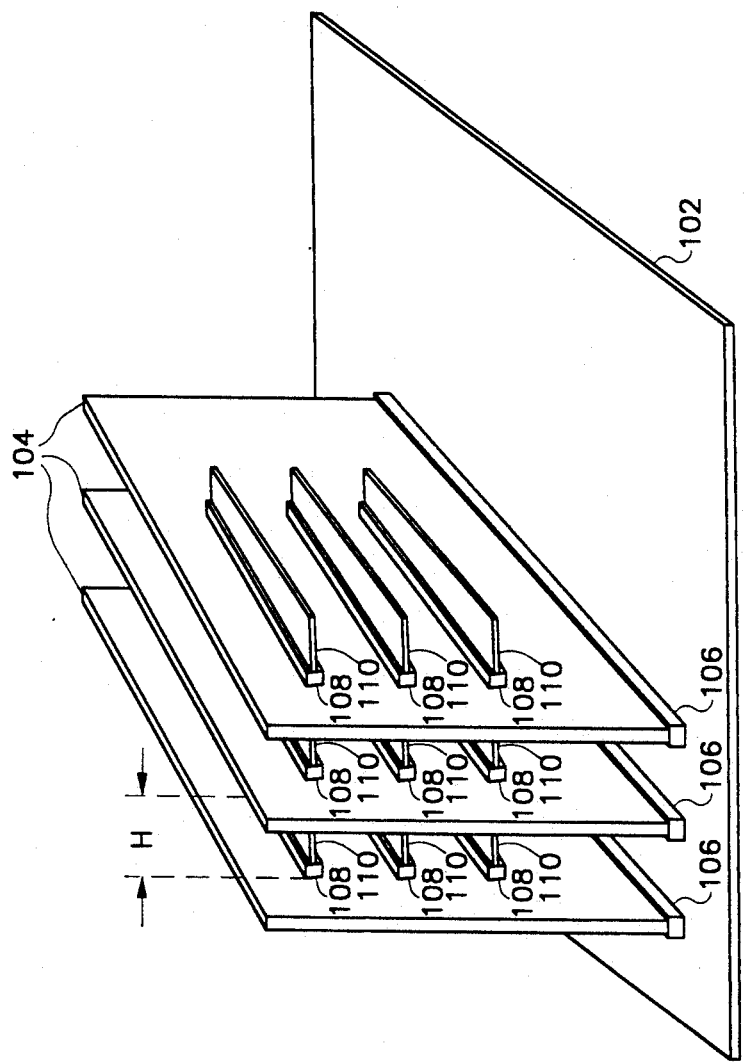
FIG. 1 is a perspective view showing three memory boards 104 connected to a backplane 102.

I. Memory Hierarchy Overview
II. Backplane and Memory Boards
III. Memory Board and SIMMs
IV. Different Types of SIMMs
   A. Type Codes
   B. SIMM Architecture
   C. The Read Cycle
   D. The Write Cycle
V. A SIMM Preferred Embodiment
   A. A Preferred Architecture and Board Layout
   B. A Preferred Height, Length and Thickness
VI. Dual Power Supply Capability
VII. Conclusion

I. Memory Hierarchy Overview

In summary, the present invention is an architecture and method of operation for the main memory of a computer system. The main memory in accordance with the present invention uses DRAMs to increase speed, decrease cost, and to increase storage capacity. The present invention allows a user to configure the memory of the computer system as desired through the physical interchange of printed circuit boards.

At the highest level, the present invention comprises one or more memory boards which are electrically connected to a computer backplane when a user physically inserts the connectors of the memory boards into corresponding connectors on the backplane. In this way, the memory boards can be swapped in and out of the memory system for repair and/or reconfiguration of the computer system's main memory capacity.

Each memory board has one or more connectors for accommodating one or more SIMMs. In accordance with the present invention, there are one or more types of SIMMs that can be inserted into these connectors without modification of the memory board. The different types of SIMMs have different memory capacities and other electrical parameters relating to data storage and retrieval. The main memory objectives of the user can therefore be readily optimized by the specific arrangement of SIMMs used in the computer system.

Specific details concerning the memory hierarchy of the present invention are described below as follows. Sections II and associated FIGS. 1-3 describe the invention from the perspective of the backplane and the memory boards. Section III and associated FIG. 4 describe a representative memory board with the connectors for the associated SIMMs. Section IV and associated FIGS. 5-7 describe the different types of SIMMs and their operation in accordance with the present invention. Section V and associated FIGS. 8A-D and 9A-B describe a specific embodiment of a SIMM in accordance with the present invention. Section VI describes the dual power supply ability of the present invention.

The terms chip, integrated circuit, monolithic device, semiconductor device and microelectronic device are often used interchangeably in this field. The present invention is applicable to all of the above as they are generally understood in the field.

The terms metal line, trace, wire, conductor, signal path and signalling medium are all related. These related terms are generally interchangeable and appear in order from most specific to most general. In this field, metal lines are sometimes referred to as traces, wires, lines, interconnect or simply metal. Metal lines, generally aluminum (Al) or an alloy of Al and copper (Cu), are conductors which provide signal paths for coupling, or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), or refractory metal silicides are examples of other conductors. Signalling medium is the most general term and encompasses the others.

The terms pins, pads and leads refer to input and/or output terminals of a connector, device, chip, printed circuit, or the like, which are used to provide electrical connection to one or more connectors, devices, chips, printed circuits, or the like.

The terms power bus(es) and power supply bus(es), as used in this application, refer collectively to metal lines which connect circuitry to voltage supplies such as $V_{dd}$, $V_{cc}$, $V_{ss}$, ground or any other voltage supply used by a chip or board.

The expression, rail-to-rail, is generally understood to mean switching the voltage magnitude of a signal from the most positive to the most negative power supply voltage available in the device, or vice versa. This is the meaning given to this expression throughout the instant description of the invention.

As discussed below, the following sections more fully describe the present invention.

II. Backplane and Memory Boards

FIG. 1 shows a perspective view of the present invention having a main backplane 102 with three associated memory boards 104. Each memory board 104 is electrically and physically connected to the backplane 102 by being plugged into a respective backplane slot 106. Each backplane slot 106 includes electrical connection means as well as physical retention means so that the memory board 104 (along an edge having a connector 226 (see FIG. 2)) is electrically and physically connected to the backplane 102.

Figure 4:
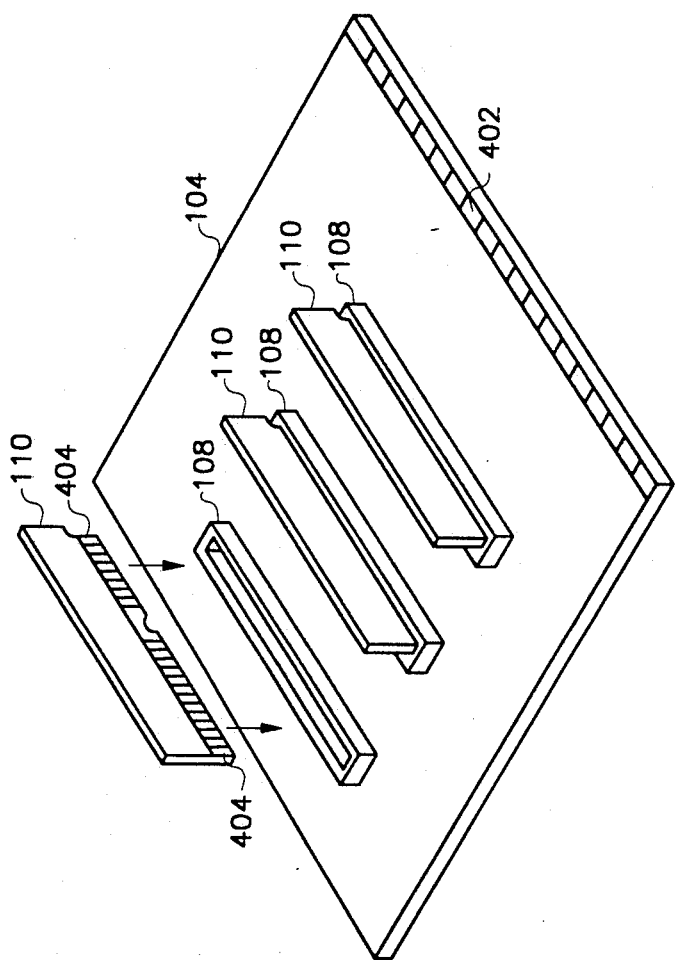
FIG. 4 is a perspective view of a memory board 104 illustrating how SIMMs 110 can be inserted into and removed from slots 108.

Each memory board 104 includes one or more slots 108. Each slot 108 can physically accommodate a single DRAM SIMM 110. As discussed below in greater detail, each slot 108 includes electrical connection means and physical retention means for electrically and physically connecting that SIMM 110 to the memory board 104 (using connector 404 of SIMM 110, as shown in FIG. 4). As will also be discussed below, it is to be understood that each slot 108 could physically accommodate a DRAM SIMM 110 having two printed circuit boards "piggy-backed" together in a sandwich configuration.

A preferred physical arrangement of the adjacent memory boards 104 in terms of the SIMMs 110 is discussed below in Section V.B.

Now that the relationship of the memory boards 104 to the backplane 102 has been explained, a description of a preferred embodiment of the physical layout and computer architecture of a memory board 104 will be discussed.

Figure 2:
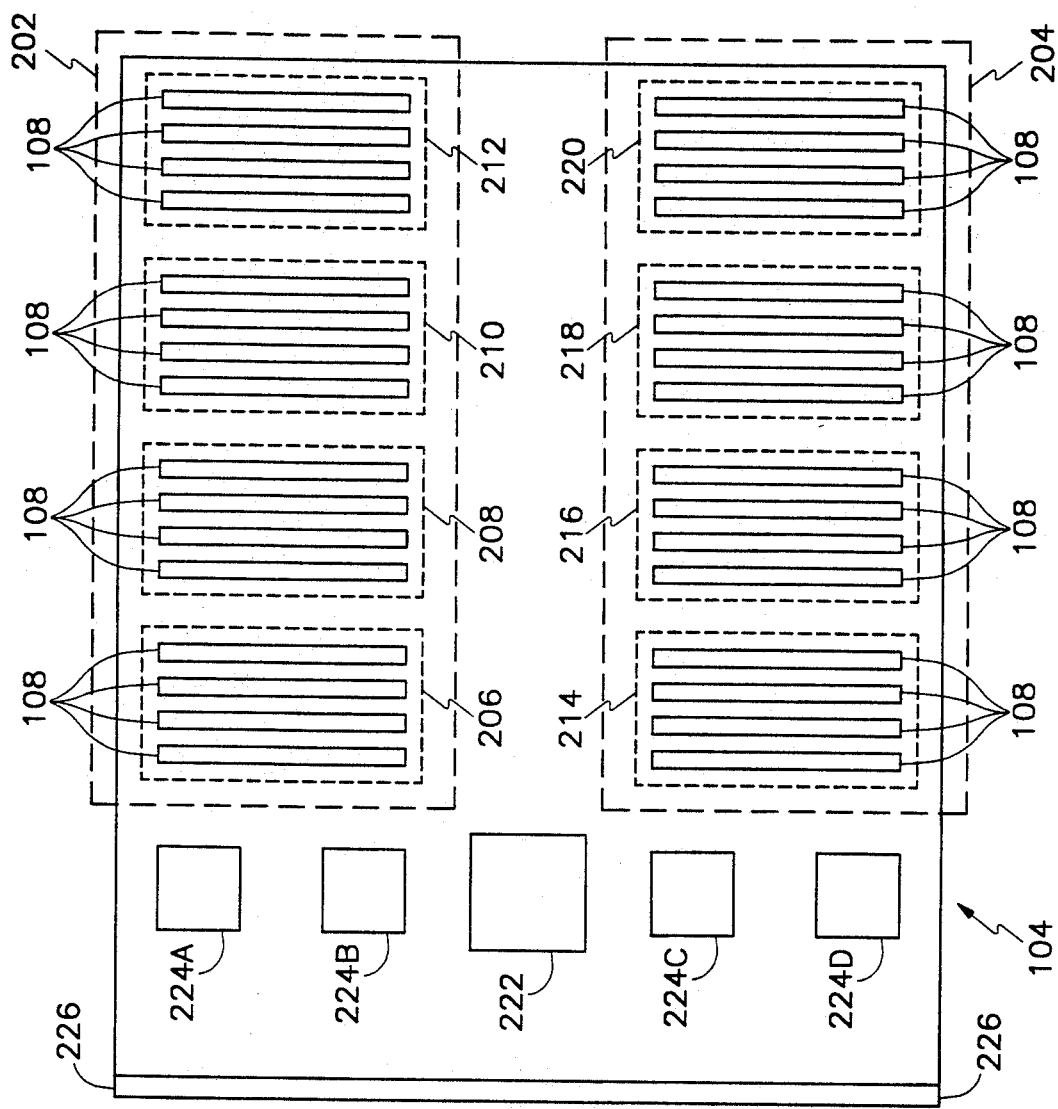
FIG. 2 is a top plan view of the physical layout of a preferred embodiment of memory board 104.

Referring now to FIG. 2, a top plan view of a representative embodiment of the physical layout of an interleaved memory board 104 is shown. This representative embodiment of memory board 104 provides two DRAM array leaves: a top array leaf is indicated by a dashed line box 202 and a bottom array leaf is indicated by a dashed line box 204. Top array leaf 202 and bottom array leaf 204 each comprise four banks of SIMM slots 108.

Specifically, top array leaf 202 has four banks of SIMM slots 108; a first bank indicated by a dashed line box 206; a second bank indicated by a dashed line box 208; a third bank indicated by a dashed line box 210; and a fourth bank indicated by a dashed line box 212. Each of these four banks 206–212 can accommodate up to four SIMMs 110.

Specifically, bottom array leaf 204 has four banks of SIMM slots 108: a first bank indicated by a dashed line box 214; a second bank indicated by a dashed line box 216; a third bank indicated by a dashed line box 218; and a fourth bank indicated by a dashed line box 220. Each of these four banks 214–220 can accommodate up to four SIMMs 110.

Memory board 104 also has a memory controller 222. In addition, there are four data controller chips 224A–224D. Data control chips 224A and 224B are used with the top array leaf 202. Data control chips 224C and 224D are used with the bottom array leaf 204.

Memory board 104 has electrical connection means and physical retention means disposed along its edge 226 (the left vertical surface in FIG. 2). These electrical connection means and physical retention means along edge 226 provide the electrical and physical connection with the slots 106 of backplane 102. Note that the edge 226 is adjacent address control chip 222 and data control chips 224A–224D. The reason for this is to increase electrical performance between backplane 102 and memory board 104.

Figure 3:
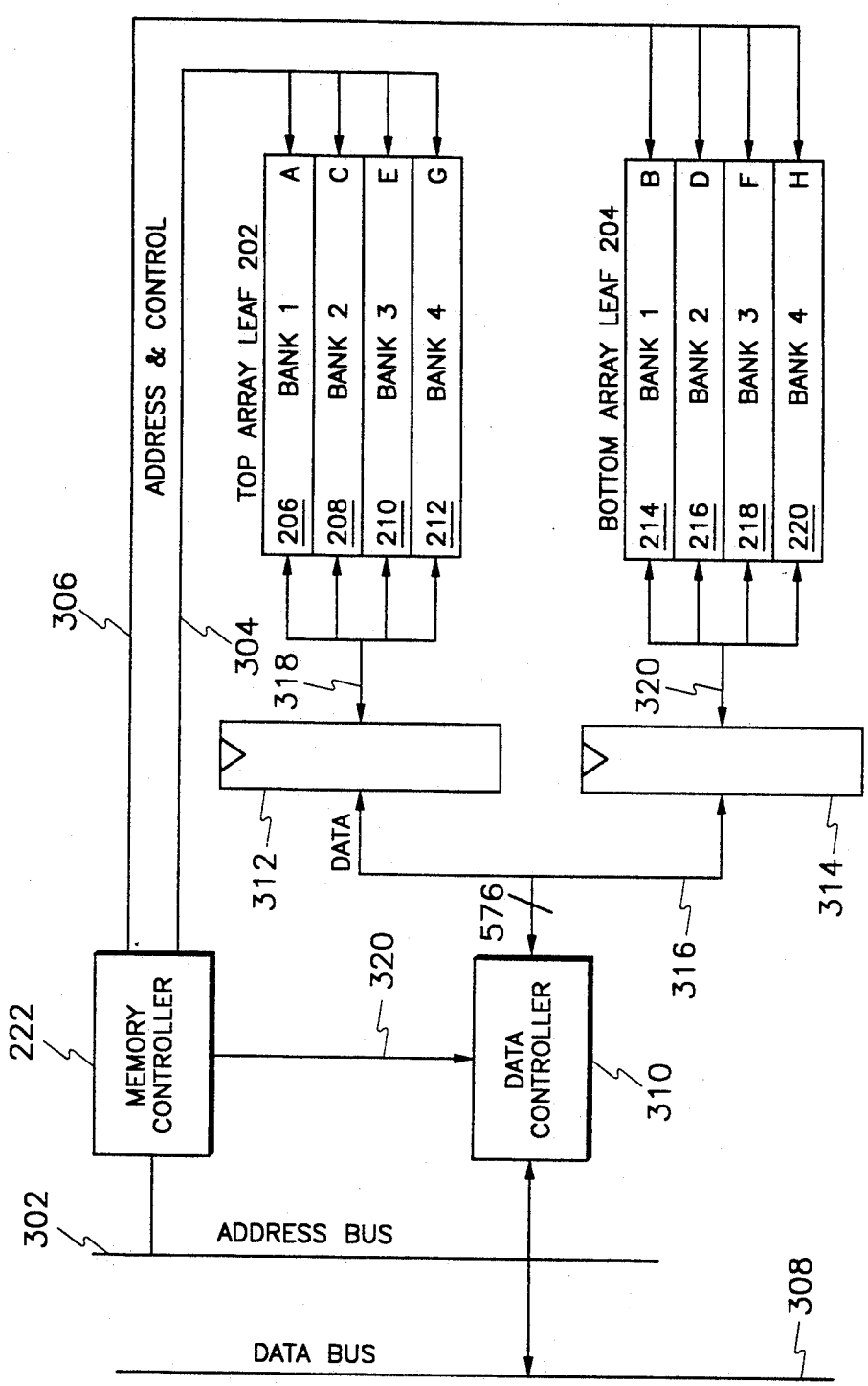
FIG. 3 is a high-level block diagram of the computer architecture of a preferred embodiment of memory board 104.

Turning now to FIG. 3, a representative computer architecture for memory board 104 is shown. An address bus 302 is connected via edge (connector) 226 and mating slot 106 to backplane 102. Memory addresses are provided by the computer system via backplane 102 so that the data at the desired memory locations in a DRAM on a SIMM 110 can be accessed via the memory board 104. The memory address is supplied on address bus 302 to memory controller 222. Memory controller 222 generates address and control signals which are communicated by a bus 304 to the top array leaf 202, and by a bus 306 to the bottom array leaf 204. Memory controller 222 also has a bus 320 for providing control to a data controller 310. Memory controller 222 provides these address and control signals via buses 304 and 306 in order to allow for data to be read or stored to or at specific memory locations in the DRAMs of SIMMs 110.

Address and control bus 304 is connected to provide the address and control signals to the banks 206, 208, 210 and 212. Similarly, address and control bus 306 is connected to provide the address and control signals to the banks 214, 216, 218 and 220.

Memory controller 222 generates address signals and control signals. The control signals that are generated are RAS, CAS and write enable (WE). These control signals are needed to control the address and operation of the memory locations of the DRAMs of the SIMMs 110. In addition, memory controller 22 has bus 320 for providing control signals to data controller 310 used in read and/or write operations. Memory controller 222, in a preferred embodiment, includes a bus arbitration and acknowledge logic, a decode logic, and two interleaved DRAM controllers. The present invention contemplates any suitable memory controller 222.

A bidirectional data bus 308 on memory board 110 is electrically connected to the backplane 102 via connector 226 and slot 106. Data is transferred to and from the computer system (not shown) by backplane 102 and bidirectional data bus 308. A preferred size for bidirectional data bus 308 is a 256-bit wide data bus. The four data control chips 224A-224D of FIG. 2 are shown collectively in FIG. 3 as a data controller 310.

A register/transceiver 312 is associated with the top array leaf 202. A register/transceiver 314 is associated with the bottom array leaf 204. The register/transceivers 312 and 314, which are located on memory board 104, provide on-board two-way buffering of data between the associated address control chips 224A-224D and the respective banks of SIMMs 110 of the top array leaf 202 or the bottom array leaf 204.

A bidirectional data bus 316 electrically connects data controller stage 310 with data register/transceivers 312 and 314. A preferred embodiment for the bidirectional data bus 316 is 576 (144×4) bits wide.

A bidirectional data bus 318 is connected between register/transceiver 312 and banks 206, 208, 210 and 212 of top array leaf 202. In a preferred mode, the data control chips 224A and 224B drive one quarter of bus 318 for each of the banks 206, 208, 210 and 212. This allows the SIMMs 110 that are plugged into the slots 108 for the particular bank to store and provide, during read-out, data words which are 144 bits wide.

Similarly, a bidirectional data bus 320 is connected between register/transceiver 314 and banks 214, 216, 218 and 220 of bottom array leaf 204. In a preferred mode, the data control chips 224C and 224D drive one quarter of bus 318 for each of the banks 214, 216, 218 and 220. This allows the SIMMs 110 that are plugged into the slots 108 for the particular bank to store and provide, during read-out, data words which are 144 bits wide. Each 144-bit data word comprises two 72-bit subwords. Each subword comprises 64 bits of user data and 8 bits of error correcting code (ECC) data. Thus, the present invention can provide error detection and correction during data transfers. This capability error detection and correction is provided by the data control chips 224A-224B. The term "data" will hereafter be used to refer to the actual user data bits and the associated ECC data bits. The preferred ECC and associated ECC logic (located in the data control chips 224A-D) is capable of correcting one-bit errors and detecting two-bit errors.

III. Memory Board and SIMMs

FIG. 4 shows a perspective view of memory board 104. For illustration purposes only, three slots 108 on memory board 104 are shown in the illustration. SIMMs 110 are mounted in slots 108 in two of the locations that are shown (these locations are the two closest to the viewer).

FIG. 4 also shows diagrammatically how a SIMM 110 can be inserted into and removed from a slot 108. In the example, this is the SIMM 110 which is furthest away from the viewer. The physical size of the SIMMs 110 and their physical spacing with respect to each other can be determined so that adjacent memory boards 104 can be disposed next to each other in a desired fashion/configuration on the backplane 102 (see FIG. 1). A preferred embodiment for the physical size of the SIMM so as to produce the optimal physical relationships is discussed below in Section V.B. Storage capacity can therefore be maximized because of the physical optimization.

As discussed below in Section V, the present invention contemplates several SIMMs having different memory capacity and performance characteristics. These different types of SIMMs have different financial costs because of memory storage capacity. It should be understood that each of these different types of SIMMs 110 have essentially the same physical dimensions in terms of the size of the printed circuit board for the SIMM. In addition, each of the different types of SIMMs 110 utilize the same connector (pad) 404 arrangement on the printed circuit board, as discussed below with respect to Table 3. Thus, these different types of SIMMs 110 can be inserted into the slots 108 without modification of the memory board 104. This allows the user to configure the main memory of the computer system to specific data storage and data read/write performance characteristics. The different types of SIMMs 110 in association with the present invention are described in more detail below in Sections IV and V.

IV. Different Types of SIMMs

A. Type Codes

As discussed below, the present invention uses a three bit type code. This allows for there to be up to eight types of SIMMs 110 (in other words, the three-bit type code can specify eight different types of SIMMs 110 because of the mathematical relationship of $2^3$). These eight different types of SIMMs 110 can be plugged into the slots 108 without rewiring either the slot 108 or the SIMM 110. This allows the user to reconfigure the memory capacity and performance of the main memory by using different types of SIMMs 110.

Before discussing the preferred computer architecture used in each of the SIMMs 110, the memory capacity of the different types of SIMMs 110 are described below in connection with Table 1.

Figure 5:
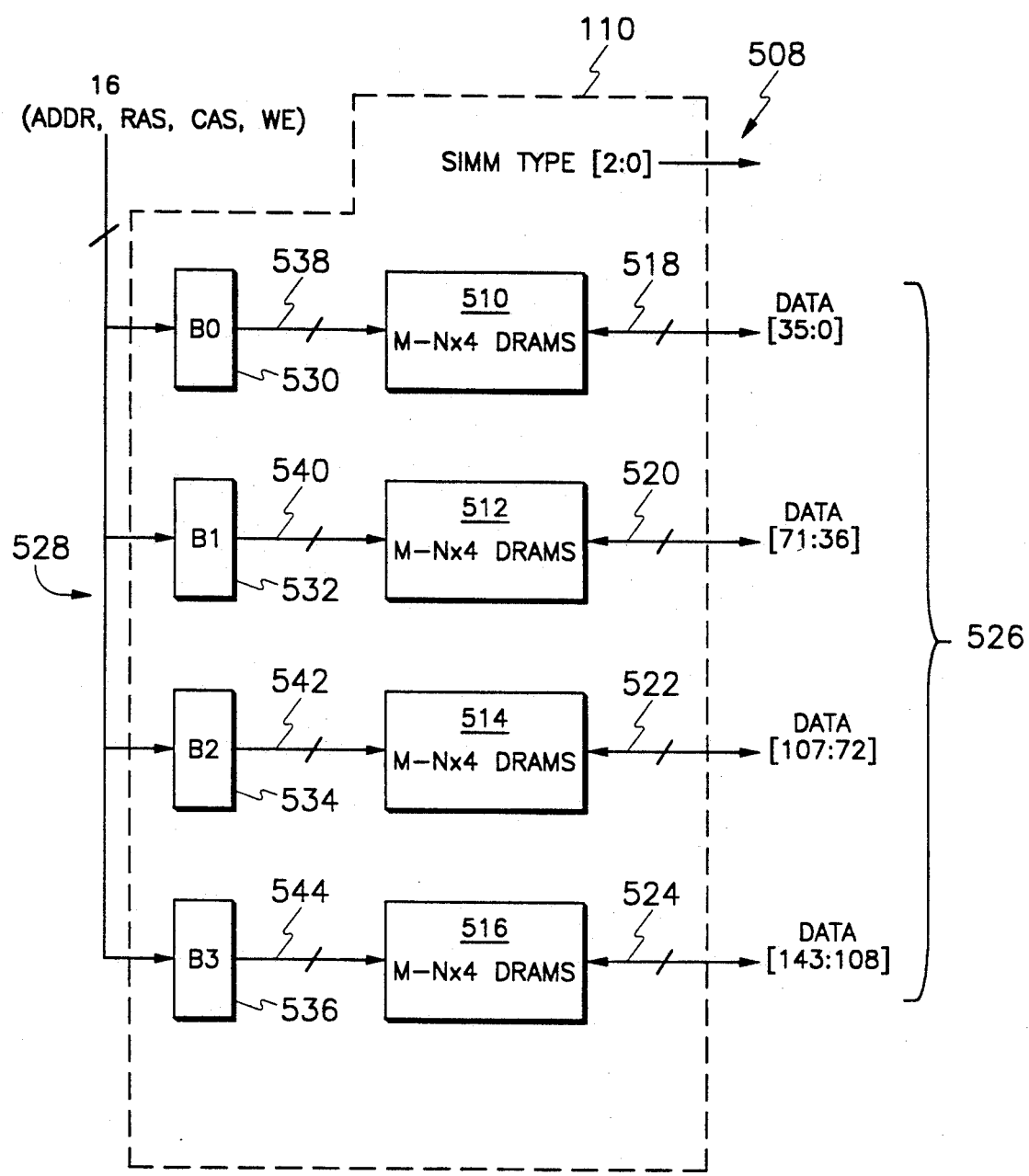
FIG. 5 shows a representative block diagram of the computer architecture of a SIMM 110 according to the present invention.

The DRAM SIMM 110 of the present invention uses three bit type code so that the memory system can determine the amount of memory on each SIMM 110 installed on the memory boards. The type code is implemented by three hardwired output signals (on a type code bus 508 as shown in FIG. 5 below) which are provided by each SIMM 110. The memory system reads the three-bit signal, represented by eight values in column 2 of Table 1 below, on bus 508 during system initialization, boot-up, or the like, in order to set initial memory parameters and determine proper memory protocols based on the detected type codes of installed SIMMs 110.

The number of hardwired type code bits can vary or be implemented with other functionally equivalent techniques as would be apparent to a person skilled in the relevant art.

TABLE 1
SIMM Type Codes

| Type/Code | Pin Value T2/T1/T0 | DRAM type | Depth | Storage Capacity | Address Bits | Row/Column |
|---|---|---|---|---|---|---|
| TYPE I/0 | 0/0/0 | 256K × 4<br>256K × 18 | 256K | 4M | 17 | 9/9 |
| TYPE II/1 | 0/0/1 | 1M × 4<br>1M × 18 | 1M | 16M | 19 | 10/10 |
| TYPE II/2 | 0/1/0 | 2M × 9 | 2M | 16M | 20 | 12/9 |
| TYPE III/3 | 0/1/1 | 4M × 4<br>4M × 18 | 4M | 64M | 21 | 11/11 |
| TYPE III/4 | 1/0/0 | 4M × 4<br>4M × 18 | 4M | 64M | 21 asymmetric | 12/10 |
| TYPE III/5 | 1/0/1 | 16M × 4 | 16M | 64M | 23 | 12/12 |
| TYPE III/6 | 1/1/0 | 16M × 4 | 16M | 64M | 23 asymmetric | 13/11 |
| TYPE III/7 | 1/1/1 | Unspecified | — | — | — | — |

The first (left hand) column in Table 1 shows the basic type of the SIMM 110, followed by a code number for the specific type in the corresponding row. Note that code 7 is unspecified. The remaining columns two through seven list type code pin values and the various pin value, memory storage capacity and architectural characteristics of those different type codes.

Column two lists the pin values of the three type code bits T2, T1 and T0. T0 is the least significant bit and T2 is the most significant bit. The (Boolean) pin values of the type codes in column one are listed in the corresponding row in column 2.

Column three lists the type of off-the-shelf DRAM chips used to "stuff" the SIMM 110 for that particular type code. Stuffing of the SIMMs refers to the mounting of DRAM chips on the printed circuit board of the SIMM. The different types of DRAM chips that can be used result in different memory storage capacity and read/write performance characteristics for the SIMM 110.

Each addressable memory location can store a particular number of bits of data. Presently, commercially available DRAM chips can store at each addressable memory location 4, 9, 16 or 18 bits of data.

Column three also shows the number of bits that can be stored at each memory location (as indicated by the number following the "x"). It should be understood that fewer DRAM chips are needed for a given storage capacity when a greater number of bits of data can be stored at an addressable memory location.

The depth is listed in column four. The "depth" of a particular DRAM chip refers to the number of addressable memory storage locations on that chip.

The value of the depth in column four multiplied by the number of bits that can be stored in each addressable memory location is equal to the storage capacity listed in column five.

The number of bits used to access the SIMM and the row and column arrangement of the SIMM address lines are listed in columns six and seven, respectively. Note that the number of address bits is larger than the total number of lines on the address portion of bus 528 (see FIG. 5 below), because the row and column addresses are multiplexed during RAS and CAS operations.

As an illustration, note that Code 0 specifies a Type I SIMM using either 256K×4 or 256K×18 size DRAMS, each being 256K bits deep, and yielding a total capacity of 4 Mbytes of storage. The 256K×18 implementation would require fewer DRAM chips than the 256K×4 implementation.

Many manufactures supply the type of DRAM chips listed in column two of Table 1. These DRAM chips are of conventional design.

B. SIMM Architecture

FIG. 5 shows a block diagram of the computer architecture of SIMM 110. This computer architecture applies to each to the different types of SIMMs 110 described above. A specific embodiment for implementing this architecture in terms of component layout and printed circuit board configuration is described below in Section V.

The architecture of FIG. 5 allows for data to be read from backplane 102 via memory board 104 to a specific addressable storage location of a DRAM on a specific SIMM 110. The architecture also allows for the data stored at a specific addressable memory location to be read out of that location and ultimately supplied to the backplane 102. As discussed below in detail, data from a plurality of memory location are read-out or read-in in a parallel fashion in the operation of SIMM 110.

The architecture of the SIMM 110 shown in FIG. 5 can be broken into three functional parts. The first part is the type code function which allows the SIMM 110 to indicate its type to the memory system. The second part deals with the reading-in and writing-out of data from the DRAMS. The third part is the addressing and control function used for the read-in and write-out data cycles.

Turning to the first functional part, a type code bus 508 indicates the type of the SIMM 110 as specified in Table 1. Type code bus 508 has three lines for carrying the three bits of type code information in parallel fashion provided by SIMM 110 to the memory system.

The second functional part deals with data storage and retrieval. 144 bit data words are supplied to a SIMM 110, or are read-out of a SIMM 110, by the main memory.

As shown in FIG. 5, there are four DRAM sets 510, 512, 514 and 516 provided in each SIMM 110. Each DRAM set 510-516 can store or retrieve 36 bits of data in parallel fashion. The four DRAM sets 510-516 thus can provide storage of 144-bit wide data words. The row and column address signals must therefore be provided to all DRAM sets/chips substantially at the same time to write or read a specific 144-bit data word.

The first DRAM set 510 is connected to a bidirectional data bus 518. The second DRAM set 512 is connected to a bidirectional data bus 520. The third DRAM set 514 is connected to a bidirectional data bus 522. The fourth DRAM set 516 is connected to a bidirectional data bus 524.

The bidirectional data buses 518, 520, 522 and 524 make up a 144-bit wide bidirectional data bus 526. Bidirectional data bus 526 is a part of bidirectional data bus 318 or bidirectional data bus 320 (see FIG. 3) of the memory board 104 depending upon which bank 206-220 the SIMM 110 is part of electrically and physically. The operation of the data read cycle is discussed below in detail in subsection C, and the operation of the data write cycle is discussed below in subsection D.

The third functional part of the computer architecture illustrated in FIG. 5 involves the addressing and control functions. An address and control bus 528 includes an address bus portion and a control bus portion. Specifically, the address bus portion comprises thirteen lines. The control bus portion comprises three lines. The 13 address signals for specifying the memory location from which or to which data is to be read or written is supplied to the SIMM 110 on the lines of the address portion of bus 528. The control signals RAS, CAS, and WE are for controlling read and write operations and are supplied to the SIMM 110 on the lines of the control portion of bus 528.

There are four on-SIMM buffers 530, 532, 534, and 536. The buffers 530-536 are used to broadcast the addresses and control signals to all DRAMs on the SIMM 110. The use of multiple buffers depends on the number of DRAMs being controlled, the total pin capacitance of the DRAMs being driven and the required speed of the data read and/or write operations. In a preferred embodiment of the present invention, the number of buffers is equal to the number of DRAM sets.

Buffer 530 is used with the address and control of DRAM set 510. Buffer 532 is used with the address and control of DRAM set 512. Buffer 534 is used with the address and control of DRAM set 514. Buffer 536 is used with the address and control of DRAM set 516.

Buffering is defined as the ability to provide additional load driving capacity and synchronization (i.e., to compensate for a difference in rate of flow of data, or time of occurrence of events) of signals when transferring data from one device to another.

Buffers 530-536 buffer the 13 address signals and the 3 control signals for the DRAM chips on SIMM 110. The buffers 530-536 are mounted on the printed circuit board of SIMM 110 to maintain the integrity of the control and address signals sent from the memory system to the DRAM chips on the SIMM 110. The use of the plural buffers 530-536 virtually eliminates signal skew and keeps signal delays well controlled. The buffers 530-536 compensate for the capacitance on the address and control lines and produce increases in the speed of addressing and control. The buffers are also configured to provide well controlled signal delay and to buffer signals so as to offset capacitive loading (i.e., total pin capacitance) caused by fan-out of the address and control signals to the DRAM chips.

The buffered address and control signals used to control DRAM set 510 are supplied by buffer 530 by a bus 538. Similarly, the buffered address and control signals used to control DRAM set 512 are supplied by buffer 532 by a bus 540. The buffered address and control signals used to control DRAM set 514 are supplied by buffer 534 by a bus 542. The buffered address and control signals used to control DRAM set 516 are supplied by buffer 536 by a bus 544.

The address and control bus 528 is connected via the connector 404 and slot 108 to either address and control bus 304 or address and control bus 306, depending on which bank 206-220 the SIMM 110 is part of.

Not shown in FIG. 5 are the power and ground buses that are connected to the SIMM 110. These are discussed below in detail in Section V.A. The power and ground connections supply the electric power needed to operate the SIMM 110.

C. The Read Cycle

Figure 6:
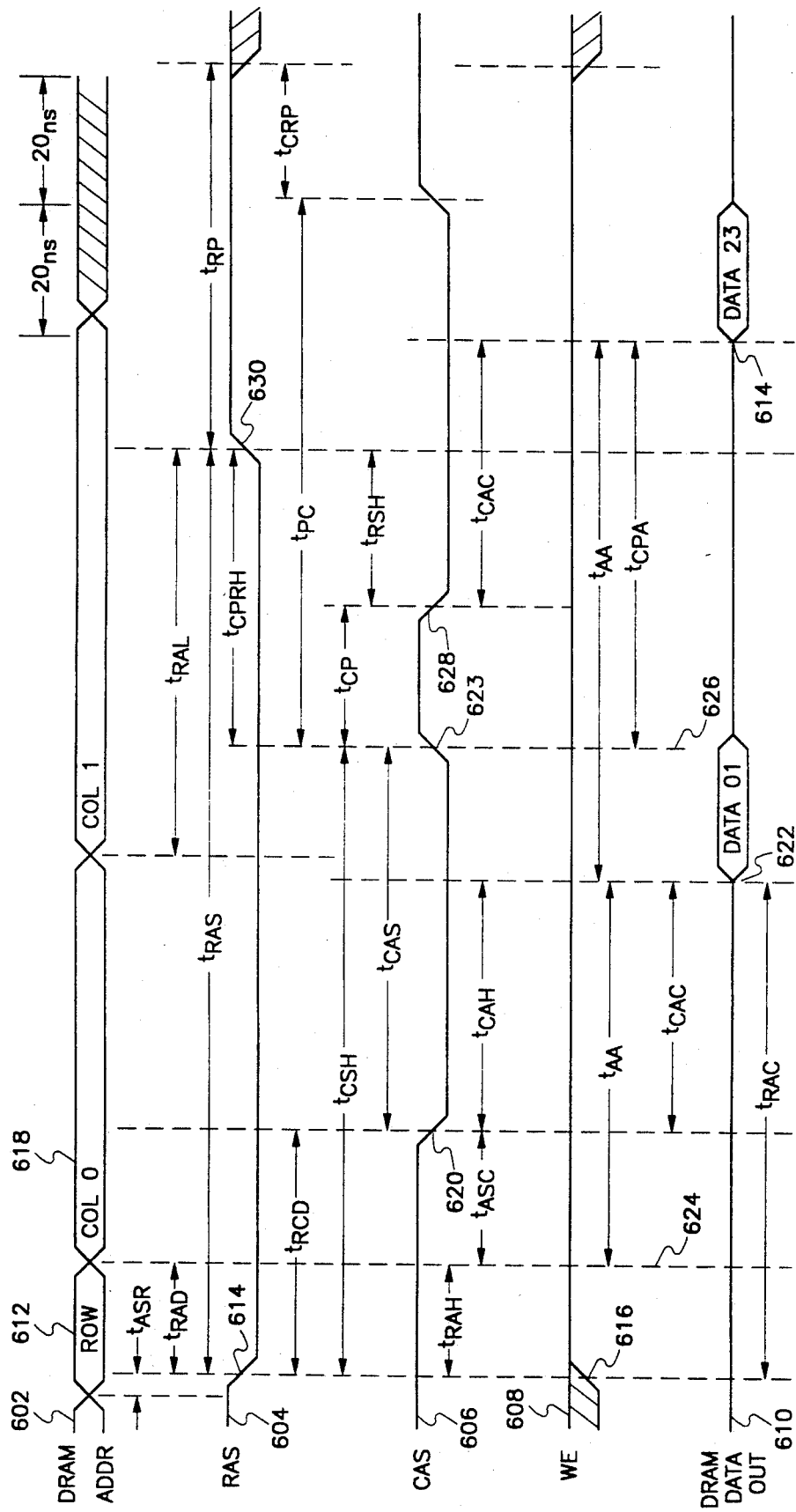
FIG. 6 illustrates a representative data read timing diagram according to the present invention.

FIG. 6 shows a representative "data read" timing diagram according to the present invention. FIG. 6 includes the five following timing traces: DRAM Address 602, RAS 604, CAS 606, Write Enable (WE) 608 and DRAM Data Out 610. The timing parameters shown in FIG. 6 generally represent time periods as measured at the SIMM connector 404, ignoring any small effect the connector itself will have on the signals. These times would appear different if measured at a location on the SIMM 110 or the memory board 402.

The row and column addresses are sent by the memory system to the SIMM 110 according to the DRAM address timing 602 shown at the top of FIG. 6. The DRAM Data Out 610 shown on the bottom of FIG. 6 represents the timing of data output from the SIMM 110 based on application of the row and column addresses and assertion of the RAS, CAS and WE control signals.

For example, the row addresses are first applied by the memory system as shown at a time 612. Next, the RAS is asserted at a time 614 along with WE at a time 616. Next a first column address is applied at a time 618, followed by a first CAS at 620.

Access time from column address strobe ($t_{CAC}$) is critical, because it defines the time 620 from when the CAS is asserted (i.e, goes low) to the time a first 144-bit data word (DATA01) becomes available, as shown at 622. CAS determines the duration for which the data is available. Therefore, CAS stays low so that data can continue to be driven out. When CAS goes high at the time 623 the data tristates (i.e., is no longer valid), because no output enable (OE) is used. The OE inputs on the DRAM chips are always tied to an active state. The CAS alone controls the data tristating.

Address access time ($t_{AA}$) is also critical, because it defines the time beginning at the switching from the row address to the column address, as shown at a time 624, and ends when the data is available at 622. Two $t_{AA}$ periods are shown in FIG. 6.

In addition, access time from row address strobe ($t_{RAC}$) is critical, because it defines the time between the beginning of RAS at 614 until the first 144-bit data word (DATA01) is available at 622.

Row and column address strobe pulse widths ($t_{RAS}$ and $t_{CAS}$ respectively), CAS cycle time ($t_{PC}$), RAS cycle time ($t_{PR}$), CAS precharge time ($t_{CP}$) and RAS precharge time ($t_{RP}$) are also shown in FIG. 6.

A parameter $t_{CAC}$ is defined as the time period between application of a second CAS at 628 to the time a second 144-bit data word (DATA23) is available at 614. It is important to apply the second CAS as soon as possible so that DATA23 can be available as soon as possible.

Another timing parameter to be noted is RAS hold time ($t_{RSH}$). The time $t_{RSH}$ is defined as the time from when the second CAS is asserted at 628 to the time when RAS is taken away (i.e., unasserted), as shown at 630. According to an aspect of the present invention, this illustrates the case where the RAS is taken away early in order to precharge for the next RAS. This permits $t_{RP}$ to start early. Early RAS precharging reduces total access cycle time and permits the SIMM 110 to have higher memory bandwidth than is possible in comparison to traditional SIMMs.

Although RAS precharging is done after two column accesses, refreshing is less frequent. Conventional CAS-before-RAS refreshing is therefore used. In this refresh operation, the signal CAS is applied just before the RAS signal. On average, one refresh is performed every 16 microseconds (this time period depends on the specific DRAMs used on the SIMM 110).

Exemplary timing parameters for the data read according to the present invention are listed below in Table 2.

The number of column addresses that are accessed per row access is determined by the size of bidirectional data bus 316 and data width of the SIMMs. As noted above in Section IV.B in connection with FIG. 5, interleaved memory board 104 has two DRAM array leaves 202 and 204, each leaf has four banks 206, 208, 210, 212, and each bank has four SIMMs 110. Because bidirectional data bus 316 is 576 bits wide, only two column accesses are needed to access data that is one fourth (144 bits) the amount of data bus 316 per row access. Since each bank has four SIMMs a single 576-bits wide word is accessed by the memory system per row access. The result is a shorter cycle time and increased memory bandwidth.

TABLE 2

| Timing Parameters for SIMM Read Operations | | |
|---|---|---|
| Parameter | MIN | MAX |
| $t_{AA}$ | — | 36.5 ns |
| $t_{CAC}$ | — | 21.5 ns |
| $t_{CPA}$ | — | 41.5 ns |
| $t_{RAC}$ | — | 66.5 ns |
| $t_{PC}$ | 50 ns | |
| $t_{CP}$ | 15 ns | |
| $t_{RSH}$ | 24 ns | |
| $t_{CLZ}$ | 0 ns | |
| $t_{OEZ}$ | 3 ns | 20 ns |
| $t_{OFF}$ | 0 ns | 21 ns |
| $t_{RC}$ | 116 ns | |
| $t_{RASP}$ | 69 ns | 100 μs |
| $t_{RAS}$ | 69 ns | 10 μs |
| $t_{CAS}$ | 24 ns | 10 μs |
| $t_{RP}$ | 40 ns | |
| $t_{ASC}$ | 3 ns | |
| $t_{ASR}$ | 3 ns | |
| $t_{DS}$ | 6 ns | |
| $t_{RCS}$ | 3 ns | |
| $t_{CWL}$ | 18 ns | |
| $t_{RWL}$ | 18 ns | |
| $t_{WCS}$ | 3 ns | |
| $t_T$ | 3 ns | 50 ns |
| $t_{WSR}$ | 16 ns | |
| $t_{CAH}$ | 18 ns | |
| $t_{DHR}$ | 56 ns | |
| $t_{DH}$ | 21 ns | |
| $t_{AR}$ | 56 ns | |
| $t_{RAH}$ | 13 ns | |
| $t_{RCH}$ | 0 ns | |
| $t_{RRH}$ | 5 ns | |
| $t_{WCH}$ | 15 ns | |
| $t_{WCR}$ | 50 ns | |
| $t_{WHR}$ | 10 ns | |
| $t_{CHR}$ | 23 ns | |
| $t_{CRP}$ | 8 ns | |

TABLE 2-continued

| Timing Parameters for SIMM Read Operations | | |
|---|---|---|
| Parameter | MIN | MAX |
| $t_{CSH}$ | 68 ns | |
| $t_{CSR}$ | 13 ns | |
| $t_{RAD}$ | 19 ns | 30 ns |
| $t_{RAL}$ | 39 ns | |
| $t_{CAL}$ | 39 ns | |
| $t_{RCD}$ | 24 ns | 45 ns |
| $t_{RPC}$ | 3 ns | |
| $t_{REF}$ | — | 32 ms |

D. The Write Cycle

Figure 7:
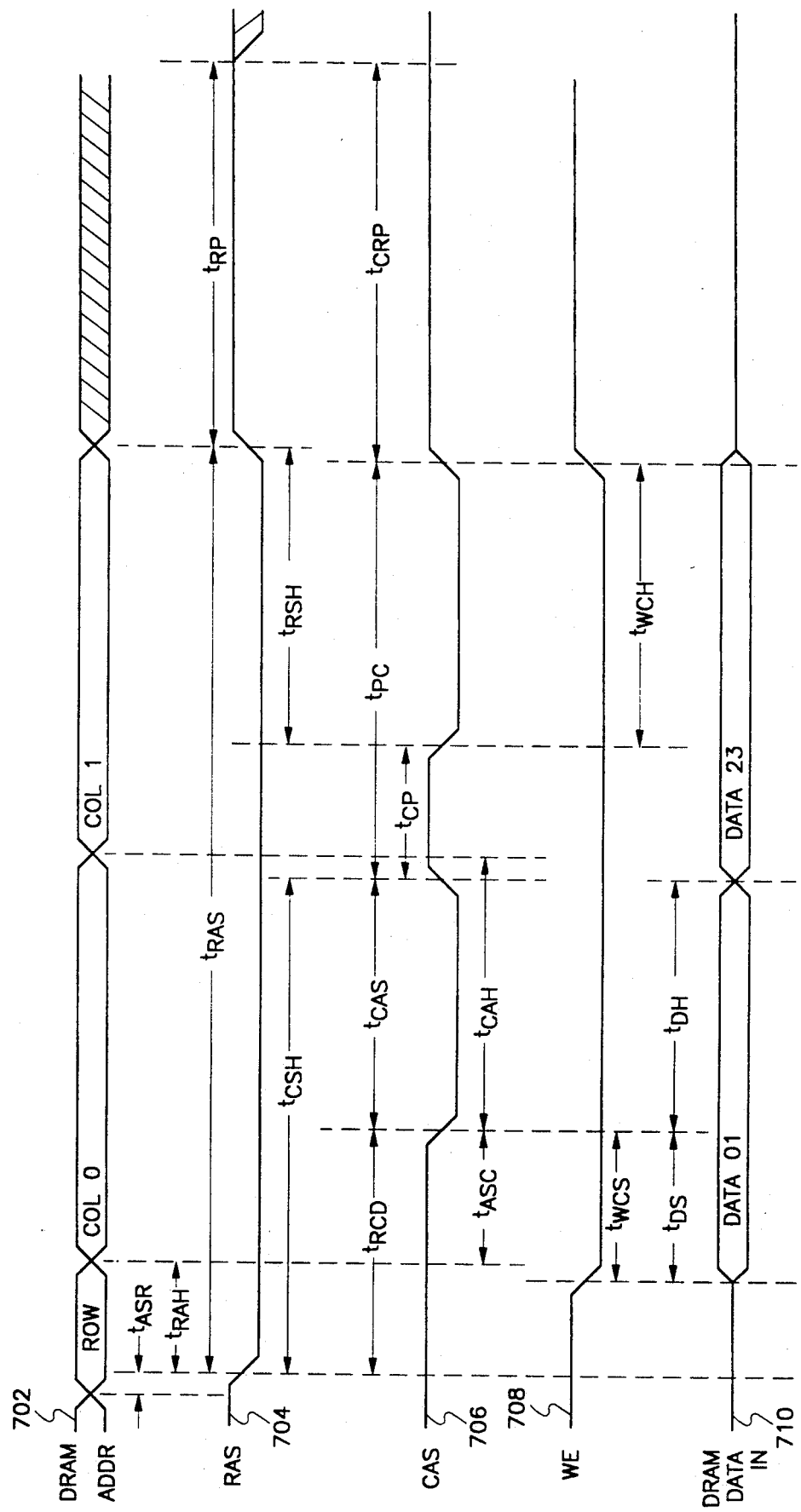
FIG. 7 illustrates a representative data write timing diagram according to the present invention.

FIG. 7 shows a representative "data write" timing diagram according to the present invention. FIG. 7 includes five timing entries or traces, which are as follows. The DRAM address is labeled trace 702. The RAS trace is labeled 704. The CAS trace is labeled 706. The write enable (WE) trace is labeled 708. The DRAM data trace is labeled 710. The timing parameters shown in the horizontal axis of FIG. 7 represent time periods as measured at the SIMM connector, ignoring any small effect the connector will have on the signals. These time would appear different if measured at a location on the SIMM 110 or the memory board 104.

V. A SIMM Preferred Embodiment

A preferred embodiment of SIMM 110 is now described. The preferred embodiment of SIMM 110 can either be a Type I or a Type II SIMM as described above in connection with Table 1. Subsection A below describes the computer architecture and preferred physical layout of a preferred embodiment of SIMM 110. Subsection B below describes the preferred physical dimensions of the printed circuit board and mounted components of a preferred embodiment of SIMM 110.

A. A Preferred Architecture and Board Layout

Figure 8:
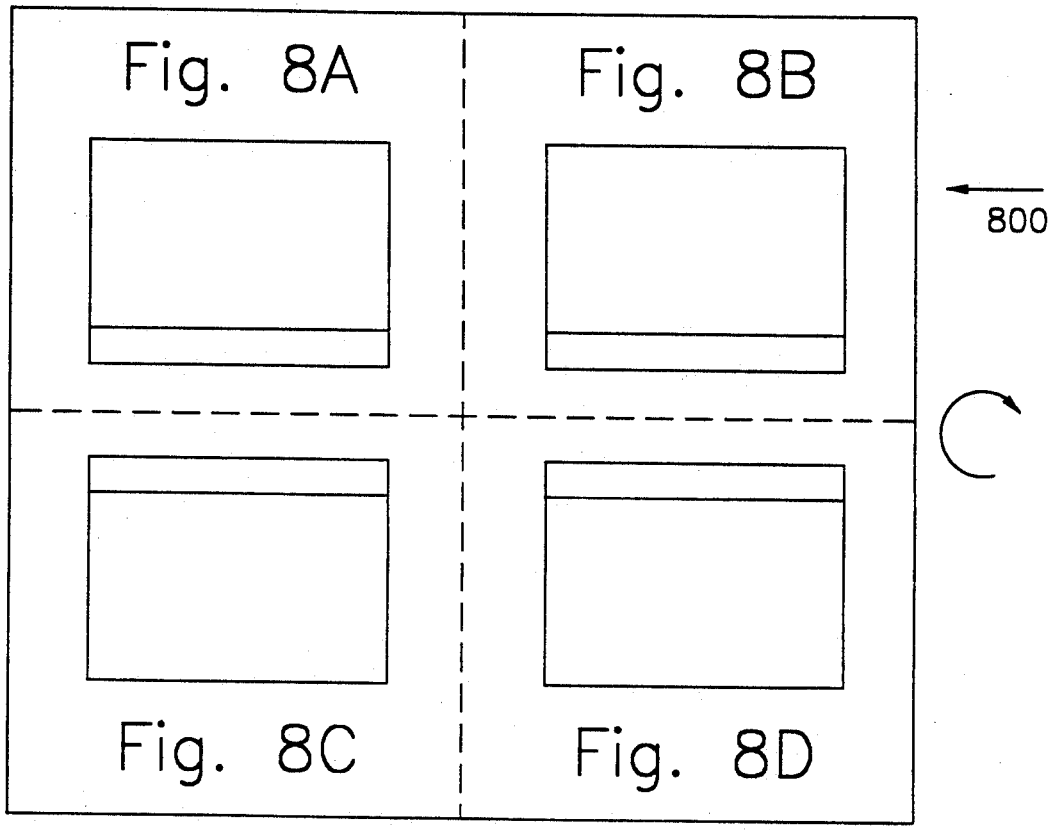
FIG. 8 shows diagrammatically the relationship of FIGS. 8A–8D which show a preferred architecture and board layout for a SIMM 110 according to the present invention.
Figure 8A:
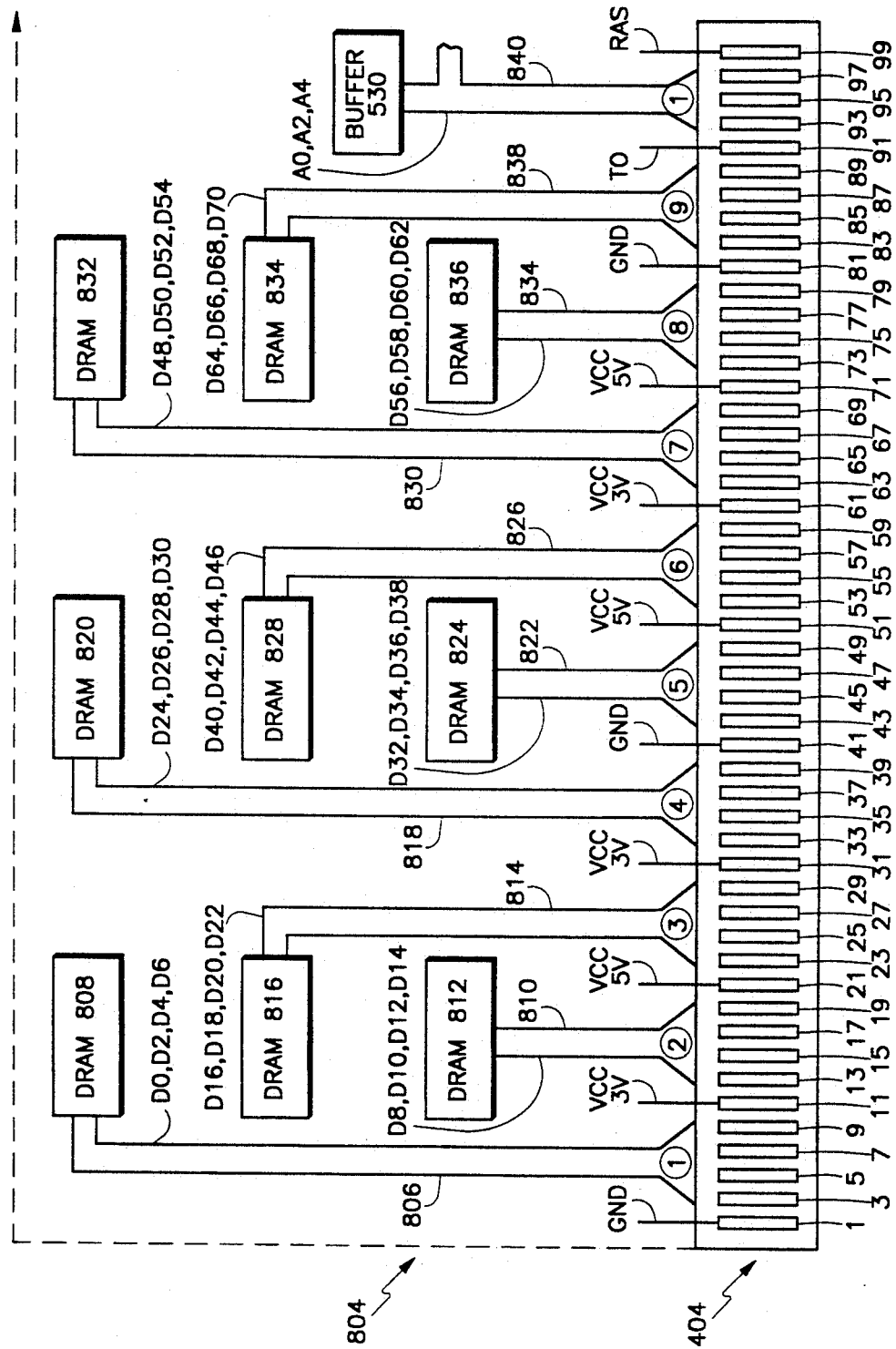
FIG. 8A shows the front left half of a preferred embodiment of SIMM 110.
Figure 8B:
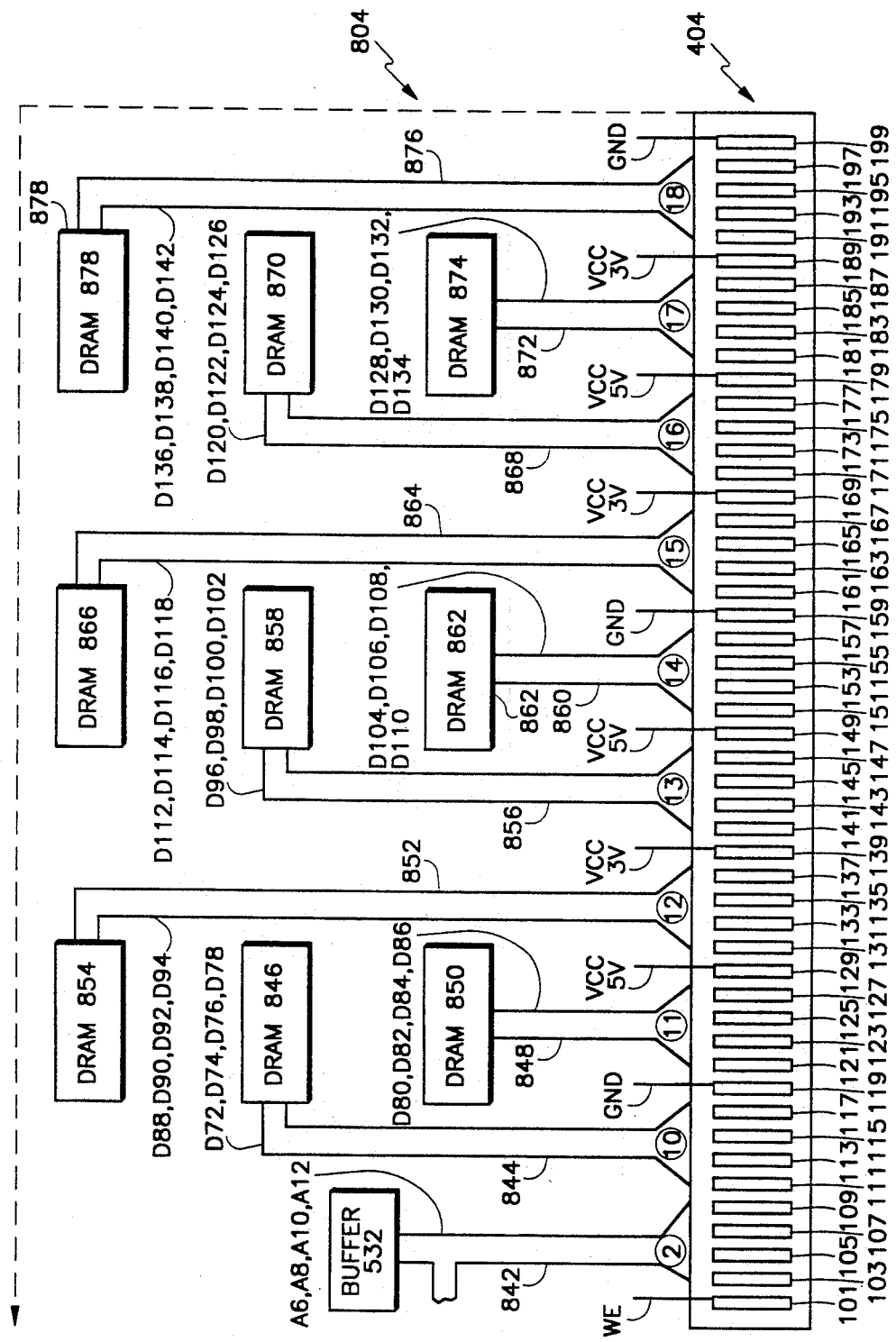
FIG. 8B shows the front right half of a preferred embodiment of SIMM 110.
Figure 8C:
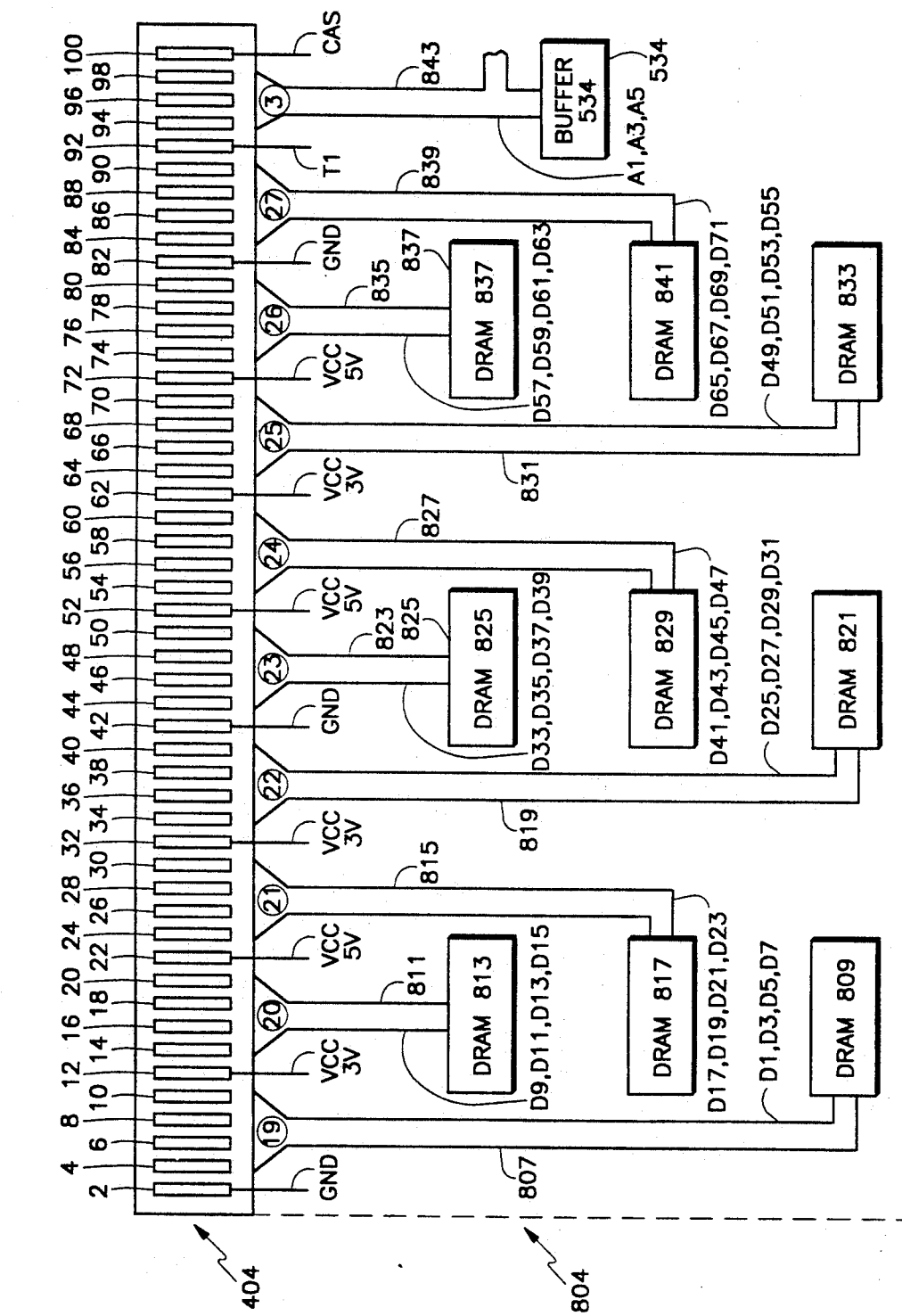
FIG. 8C shows the back left half of a preferred embodiment of SIMM 110.
Figure 8D:
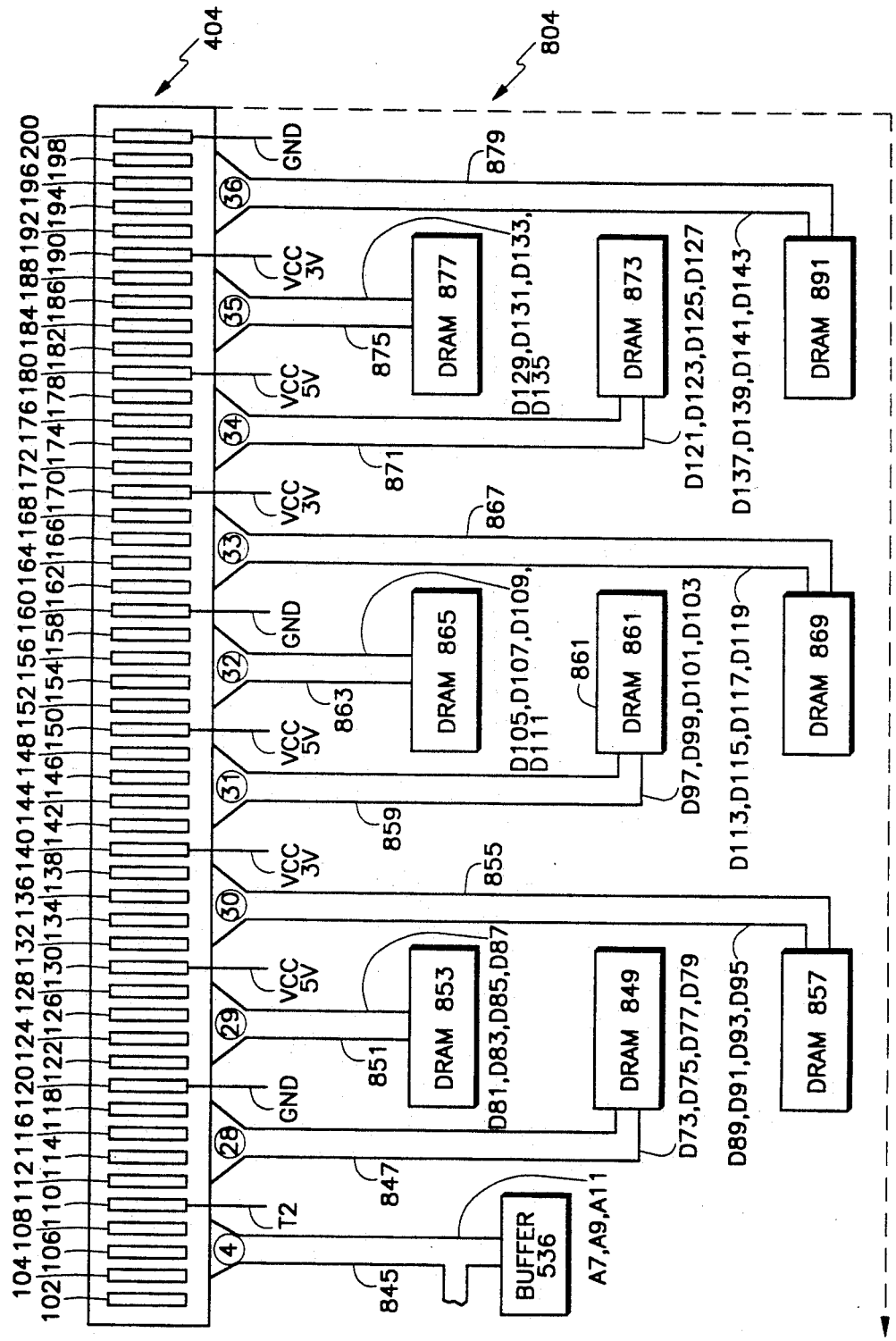
FIG. 8D shows the back right half of a preferred embodiment of SIMM 110.

FIG. 8 shows diagrammatically the relationships of FIGS. 8A-8D. FIGS. 8A-8D show the computer architecture and preferred physical layout of a preferred embodiment of SIMM 110. FIGS. 8A and 8B show the front of the preferred embodiment of SIMM 110. FIGS. 8C and 8D show the back of the preferred embodiment of SIMM 110 which is obtained by rotating SIMM 110 along the horizontal dashed line of FIG. 8 by a clockwise amount of 180° looking in the direction of FIG. 8B as indicated by the arrow 800.

FIG. 8 implements a preferred embodiment of the SIMM 110 architecture described in connection with FIG. 5 in Section IV.B above. The preferred embodiment of FIG. 8 includes a 200 pin (pad) male connector 404, which is configured so as to provide electrical and physical connection with a corresponding slot 108 (see FIG. 4 for a diagram showing the electrical and physical connection operation). The SIMM 110 of FIG. 8 has a printed circuit board 802 which has disposed on its front surface the 100 odd-numbered connector pads (pins) of connector 404 (see FIGS. 8A and 8B), and which has disposed on its back surface the 100-even numbered connector pads (pins) of connector 404 (see FIGS. 8C and 8D). Half of the electrical components which comprise SIMM 110 are mounted on the front surface of printed circuit board 804, and the other half are mounted on the back surface.

Buffer 530 and its DRAM set 510 are mounted on the front left half of printed circuit board 804 (see FIG.

8A). Buffer 532 and its DRAM set 512 are mounted on the front right half of printed circuit board 804 (see FIG. 8B). Buffer 534 and its DRAM set 514 are mounted on the back left half of printed circuit board 804 (see FIG. 8C). Buffer 536 and its DRAM set 516 are mounted on the back right half of printed circuit board 804 (see FIG. 8D). It should be noted that FIG. 5 shows the actual number of data, address, control and type code lines in the preferred computer architecture, whereas FIG. 8 shows an actual implementation with respect to connector 404 of these lines in a preferred embodiment of SIMM 110.

Table 3 shown below shows the pin (also called pad) assignment for connector 404 of the preferred embodiment of FIG. 8. It should be noted that the 100 odd-numbered pins (pads) are physically disposed on the front side of printed circuit board 804 (beginning with the left hand side and running to the right hand side with reference to FIG. 8), and that the 100 even-numbered pins (pads) are physically disposed on the back side of printed circuit board 804 (beginning with the left hand side and running to the right hand side with reference to FIG. 8).

TABLE 3

SIMM Pin/Pad Assignments

| Pin # | Assignment | Pin # | Assignment |
|---|---|---|---|
| 1 | GND | 101 | WE |
| 2 | GND | 102 | N/C |
| 3 | D0 | 103 | A6 |
| 4 | D1 | 104 | A7 |
| 5 | D2 | 105 | A8 |
| 6 | D3 | 106 | A9 |
| 7 | D4 | 107 | A10 |
| 8 | D5 | 108 | A11 |
| 9 | D6 | 109 | A12 |
| 10 | D7 | 110 | T2 |
| 11 | VCC-3V | 111 | D72 |
| 12 | VCC-3V | 112 | D73 |
| 13 | D8 | 113 | D74 |
| 14 | D9 | 114 | D75 |
| 15 | D10 | 115 | D76 |
| 16 | D11 | 116 | D77 |
| 17 | D12 | 117 | D78 |
| 18 | D13 | 118 | D79 |
| 19 | D14 | 119 | GND |
| 20 | D15 | 120 | GND |
| 21 | VCC-5V | 121 | D80 |
| 22 | VCC-5V | 122 | D81 |
| 23 | D16 | 123 | D82 |
| 24 | D17 | 124 | D83 |
| 25 | D18 | 125 | D84 |
| 26 | D19 | 126 | D85 |
| 27 | D20 | 127 | D86 |
| 28 | D21 | 128 | D87 |
| 29 | D22 | 129 | VCC-5V |
| 30 | D23 | 130 | VCC-5V |
| 31 | VCC-3V | 131 | D88 |
| 32 | VCC-3V | 132 | D89 |
| 33 | D24 | 133 | D90 |
| 34 | D25 | 134 | D91 |
| 35 | 3S6 | 135 | D92 |
| 36 | D27 | 136 | D93 |
| 37 | D28 | 137 | D94 |
| 38 | D29 | 138 | D95 |
| 39 | D30 | 139 | VCC-3V |
| 40 | D31 | 140 | VCC-3V |
| 41 | GND | 141 | D96 |
| 42 | GND | 142 | D97 |
| 43 | D32 | 143 | D98 |
| 44 | D33 | 144 | D99 |
| 45 | D34 | 145 | D100 |
| 46 | D35 | 146 | D101 |
| 47 | D36 | 147 | D102 |
| 48 | D37 | 148 | D103 |
| 49 | D38 | 149 | VCC-5V |
| 50 | D39 | 150 | VCC-5V |
| 51 | VCC-5V | 151 | D104 |

TABLE 3-continued

SIMM Pin/Pad Assignments

| Pin # | Assignment | Pin # | Assignment |
|---|---|---|---|
| 52 | VCC-5V | 152 | D105 |
| 53 | D40 | 153 | D106 |
| 54 | D41 | 154 | D107 |
| 55 | D42 | 155 | D108 |
| 56 | D43 | 156 | D109 |
| 57 | D44 | 157 | D110 |
| 58 | D45 | 158 | D111 |
| 59 | D46 | 159 | GND |
| 60 | D47 | 160 | GND |
| 61 | VCC-3V | 161 | D112 |
| 62 | VCC-3V | 162 | D113 |
| 63 | D48 | 163 | D114 |
| 64 | D49 | 164 | D115 |
| 65 | D50 | 165 | D116 |
| 66 | D51 | 166 | D117 |
| 67 | D52 | 167 | D118 |
| 68 | D53 | 168 | D119 |
| 69 | D54 | 169 | VCC-3V |
| 70 | D55 | 170 | VCC-3V |
| 71 | VCC-5V | 171 | D120 |
| 72 | VCC-5V | 172 | D121 |
| 73 | D56 | 173 | D122 |
| 74 | D57 | 174 | D123 |
| 75 | D58 | 175 | D124 |
| 76 | D59 | 176 | D125 |
| 77 | D60 | 177 | D126 |
| 78 | D61 | 178 | D127 |
| 79 | D62 | 179 | VCC-5V |
| 80 | D63 | 180 | VCC-5V |
| 81 | GND | 181 | D128 |
| 82 | GND | 182 | D129 |
| 83 | D64 | 183 | D130 |
| 84 | D65 | 184 | D131 |
| 85 | D66 | 185 | D132 |
| 86 | D67 | 186 | D133 |
| 87 | D68 | 187 | D134 |
| 88 | D69 | 188 | D135 |
| 89 | D70 | 189 | VCC-3V |
| 90 | D71 | 190 | VCC-3V |
| 91 | T0 | 191 | D136 |
| 92 | T1 | 192 | D137 |
| 93 | A0 | 193 | D138 |
| 94 | A1 | 194 | D139 |
| 95 | A2 | 195 | D140 |
| 96 | A3 | 196 | D141 |
| 97 | A4 | 197 | D142 |
| 98 | A5 | 198 | D143 |
| 99 | RAS | 199 | GND |
| 100 | CAS | 200 | GND |

Turning now to FIG. 8A, the left front half of the preferred embodiment of SIMM 110 is now described. Power to the SIMM 110 is supplied by connector 404 as follows. Three pads 11, 31 and 61 are each electrically connected to receive VCC at the 3 volt level. Three pads 21, 51 and 71 are each electrically connected to receive VCC at the 5 volt level. Three pads 1, 41 and 81 are each connected to electrical ground (GND).

Data is read into and out of the front half of SIMM 110 as follows. The DRAMs which are found in FIG. 8A are the nine DRAMs which comprise DRAM set 510 of FIG. 5.

A first bidirectional data bus 806, having four lines, comprises a D0 line, a D2 line, a D4 line, and a D6 line. The D0 line is electrically connected to a pad 3, the D2 line is electrically to a pad 5, the line D4 is electrically to a pad 7 and the D6 line is electrically connected to a pad 9. The other end of the first data bus 806 is electrically connected to a DRAM 808. DRAM 808 is part of DRAM set 510.

A second bidirectional data bus 810, having four lines, comprises a D8 line, a D10 line, a D12 line, and a D14 line. The D8 line is electrically connected to a pad 13, the D10 line is electrically connected to a pad 15, the line D12 is electrically connected to a pad 17 and the D14 line is electrically connected to a pad 19. The other end of the first data bus 810 is electrically connected to a DRAM 812. DRAM 812 is part of DRAM set 510.

A third bidirectional data bus 814, having four lines, comprises a D16 line, a D18 line, a D20 line, and a D22 line. The D16 line is electrically connected to a pad 23, the D18 line is electrically connected to a pad 25, the line D20 is electrically connected to a pad 27 and the D22 line is electrically connected to a pad 29. The other end of the first data bus 814 is electrically connected to a DRAM 816. DRAM 816 is part of DRAM set 510.

A fourth bidirectional data bus 818, having four lines, comprises a D24 line, a D26 line, a D28 line, and a D30 line. The D24 line is electrically connected to a pad 33, the D26 line is electrically connected to a pad 35, the line D28 is electrically connected to a pad 37 and the D30 line is electrically connected to a pad 39. The other end of the first data bus 818 is electrically connected to a DRAM 820. DRAM 820 is part of DRAM set 510.

A fifth bidirectional data bus 822, having four lines, comprises a D32 line, a D34 line, a D36 line, and a D38 line. The D32 line is electrically connected to a pad 43, the D34 line is electrically connected to a pad 45, the line D36 is electrically connected to a pad 47 and the D38 line is electrically connected to a pad 49. The other end of the first data bus 822 is electrically connected to a DRAM 824. DRAM 824 is part of DRAM set 510.

A sixth bidirectional data bus 826, having four lines, comprises a D40 line, a D42 line, a D44 line, and a D46 line. The D40 line is electrically connected to a pad 53, the D42 line is electrically connected to a pad 55, the line D44 is electrically connected to a pad 57 and the D46 line is electrically connected to a pad 59. The other end of the first data bus 826 is electrically connected to a DRAM 828. DRAM 828 is part of DRAM set 510.

A seventh bidirectional data bus 830, having four lines, comprises a D48 line, a D50 line, a D52 line, and a D54 line. The D48 line is electrically connected to a pad 63, the D50 line is electrically connected to a pad 65, the line D52 is electrically connected to a pad 67 and the D54 line is electrically connected to a pad 69. The other end of the first data bus 830 is electrically connected to a DRAM 832. DRAM 832 is part of DRAM set 510.

An eighth bidirectional data bus 834, having four lines, comprises a D56 line, a D58 line, a D60 line, and a D62 line. The D65 line is electrically connected to a pad 73, the D58 line is electrically connected to a pad 75, the line D60 is electrically connected to a pad 77 and the D62 line is electrically connected to a pad 79. The other end of the first data bus 834 is electrically connected to a DRAM 836. DRAM 836 is part of DRAM set 510.

A ninth bidirectional data bus 838, having four lines, comprises a D64 line, a D66 line, a D68 line, and a D70 line. The D64 line is electrically connected to a pad 83, the D66 line is electrically connected to a pad 85, the line D68 is electrically connected to a pad 87 and the D70 line is electrically connected to a pad 89. The other end of the first data bus 838 is electrically connected to a DRAM 840. DRAM 840 is part of DRAM set 510.

The first data bus 806 through the ninth data bus 838 comprise the data bus 518 of FIG. 5.

A first address bus 840 is electrically connected to buffer 530 at one end for buffering the address signals A0, A2 and A4. The other end of first address bus 840 is electrically connected to pads 93 (for the line carrying A0), pad 95 (for the line carrying A2) and pad 97 (for the line carrying A4). The first address bus 840 also branches for electrical connection to buffers 532, 534 and 536. Buffer 530 receives the remaining address signals via address buses 842, 843 and 845, as discussed below (but not shown in FIG. 8A).

The type code and control signals provided to this portion of the connector 440 are discussed below.

FIG. 8B has a computer architecture and physical layout similar to that of FIG. 8A. The pads of connector 404 are in accordance with the information set forth in Table 3 above. For purposes of brevity, only the names of the data and address buses are described here. DRAM set 512 of FIG. 5 comprises the nine DRAM chips of FIG. 8B as follows: 846, 850, 854, 858, 862, 866, 870, 874 and 878.

A tenth bidirectional data bus 844 is electrically connected on one end to DRAM 846 and at the other end in accordance with the information in Table 3.

A eleventh bidirectional data bus 848 is electrically connected on one end to DRAM 850 and at the other end in accordance with the information in Table 3.

A twelfth bidirectional data bus 852 is electrically connected on one end to DRAM 854 and at the other end in accordance with the information in Table 3.

A thirteenth bidirectional data bus 856 is electrically connected on one end to DRAM 858 and at the other end in accordance with the information in Table 3.

A fourteenth bidirectional data bus 860 is electrically connected on one end to DRAM 862 and at the other end in accordance with the information in Table 3.

A fifteenth bidirectional data bus 864 is electrically connected on one end to DRAM 866 and at the other end in accordance with the information in Table 3.

A sixteenth bidirectional data bus 868 is electrically connected on one end to DRAM 870 and at the other end in accordance with the information in Table 3.

A seventeenth bidirectional data bus 872 is electrically connected on one end to DRAM 874 and at the other end in accordance with the information in Table 3.

A eighteenth bidirectional data bus 876 is electrically connected on one end to DRAM 878 and at the other end in accordance with the information in Table 3.

The tenth data bus 844 through the eighteenth data bus 876 comprise the data bus 520 of FIG. 5.

A second address bus 842 is electrically connected to buffer 532 at one end for buffering the address signals A6, A8, A10 and A12. The other end of first address bus 842 is electrically connected to pads 103 (for the line carrying A6), pad 105 (for the line carrying A8), pad 107 (for the line carrying A10) and pad 109 (for the line carrying A12). The second address bus 842 also branches for electrical connection to buffers 530, 534 and 536. Buffer 532 receives the remaining address signals via address buses 840, 843 and 845 (not shown in FIG. 8B).

The type code and control signals provided to this portion of the connector 440 are discussed below.

The bottom left half of SIMM 110 is shown in FIG. 8C. The assignment of the pads of the even-numbered pads 2-100 of connector 404 are specified in Table 3. The nine DRAMs shown in FIG. 8C comprise the DRAM set 514 of FIG. 5. There are nine data buses which are labeled as follows: a nineteenth bidirectional data bus 807 connected at one end to DRAM 809; a twentieth bidirectional data bus 811 connected at one end to DRAM 813; a twenty first bidirectional data bus 815 connected at one end to DRAM 817; a twenty second bidirectional data bus 819 connected at one end to DRAM 821; a twenty third bidirectional data bus 823 connected at one end to DRAM 825; a twenty fourth bidirectional data bus 827 connected at one end to DRAM 829; a twenty fifth bidirectional data bus 831 connected at one end to DRAM 833; a twenty sixth bidirectional data bus 835 connected at one end to DRAM 837; a twenty seventh bidirectional data bus 839 connected at one end to DRAM 841.

The nineteenth data bus 807 through the twenty seventh data bus 839 comprise the data bus 522 of FIG. 5.

A third address bus 843 is electrically connected to buffer 534 at one end for buffering the address signals A1, A3, and A5. The other end of first address bus 843 is electrically connected to pads 94 (for the line carrying A1), pad 96 (for the line carrying A3), and pad 98 (for the line carrying A5). The third address bus 843 also branches for electrical connection to buffers 530, 532 and 536. Buffer 534 receives the remaining address signals via address buses 840, 842 and 845 (not shown in FIG. 8C).

The type code and control signals provided to this portion of the connector 440 are used below.

The bottom right half of SIMM 110 is shown in FIG. 8D. The assignment of the pads of the even-numbered pads 102-200 of connector 404 are specified in Table 3. The nine DRAMs shown in FIG. 8D comprise the DRAM set 516 of FIG. 5. There are nine data buses which are labeled as follows: a twenty eighth bidirectional data bus 847 connected at one end to DRAM 849; a twenty ninth bidirectional data bus 821 connected at one end to DRAM 853; a thirtieth bidirectional data bus 855 connected at one end to DRAM 857; a thirty first bidirectional data bus 859 connected at one end to DRAM 861; a thirty second bidirectional data bus 863 connected at one end to DRAM 865; a thirty third bidirectional data bus 867 connected at one end to DRAM 869; a thirty fourth bidirectional data bus 871 connected at one end to DRAM 873; a thirty fifth bidirectional data bus 875 connected at one end to DRAM 877; a thirty sixth bidirectional data bus 879 connected at one end to DRAM 881.

The twenty eighth data bus 847 through the thirty sixth data bus 879 comprise the data bus 524 of FIG. 5.

A fourth address bus 845 is electrically connected to buffer 536 at one end for buffering the address signals A7, A9, and A11. The other end of first address bus 845 is electrically connected to pads 104 (for the line carrying A7), pad 106 (for the line carrying A9), and pad 108 (for the line carrying A11). The fourth address bus 845 also branches for electrical connection to buffers 530, 532 and 534. Buffer 536 receives the remaining address signals via address buses 840, 842 and 843 (not shown in FIG. 8D).

The type code and control signals provided to this portion of the connector 440 are used below.

The control lines for SIMM 110 as shown in FIG. 8 are as follows. RAS is electrically connected to a pad 99. CAS is electrically connected to a pad 100. WE is electrically connected to a pad 101.

The type codes for the SIMM 1 10 of FIG. 8 are as follows. The three type code lines that designate the type of the SIMM in accordance with Table 1 discussed above are provided as follows: the T0 bit is output by the SIMM 110 on a pad 91; and the T1 bit is output by the SIMM 110 on a pad 92; the T2 bit is output by the SIMM 110 on a pad 110.

B. A Preferred Height, Length and Thickness

Figure 9A:
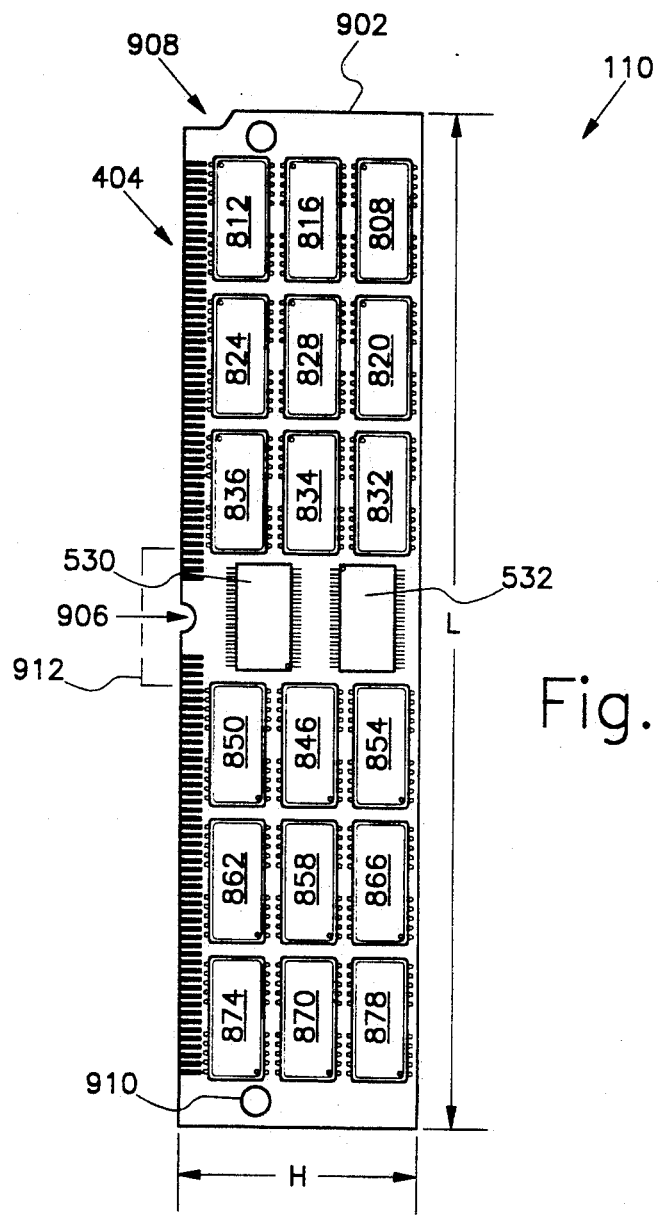
FIGS. 9A and 9B show a preferred height, length and thickness for a SIMM 110 according to the present invention.
Figure 9B:
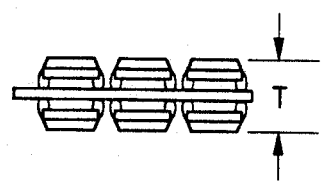

A preferred embodiment of the physical layout of the DRAM SIMM 110 of the present invention is shown in FIGS. 9A and 9B. FIG. 9A is a side view of the SIMM and is approximately to scale. FIG. 9B is an end view of the SIMM. The embodiment of FIGS. 9A and 9B represent a Type I or 11 SIMM as described in Table 1.

The dimensions disclosed below are given by way of example. These dimensions for the SIMM are optimizations to meet the necessary physical requirements of the memory board 104 and backplane 102, the storage requirements of the computer system and the timing requirements of the memory system. The preferred dimensions minimize trace length to reduce capacitance and loading effects on the printed circuit board 802.

A PC board 902 has a 200-pin connector 404 (as specified in Table 3), a circular shaped center alignment notch 906, an end extraction notch 908, and tooling holes 910. The alignment notch 906 and extraction notch 908 prevent the SIMM 110 from being inserted backwards into the slot 108. The tooling holes 910 receive retention clips attached to slot 108 for securing the SIMM 110 when it is in slot 108.

A length dimension "L" of the SIMM 110 is driven by the size of the slot 108 that can accommodate the necessary 200 signal pins (pads) for the SIMM 110. A 200 pin SIMM socket 108 was chosen to accommodate the 144 bits of data, 13 address lines, RAS, CAS, WE, 3 Type Code lines, two different voltage level lines, and ground lines. A preferred embodiment for socket (slot) 108 is a commercially available 200-pin SIMM socket, Part No. 91-1793-1-100, manufactured by AMP Corporation, Harrisburg, Pa., U.S.A. Length dimension L ranges between about 5.5 and 5.75 inches long measuring from one end to the other of the printer circuit board 902 of SIMM 110. A preferred length is about 5.625 inches.

A height dimension "H" of SIMM 110 is driven by the board-to-board spacing between adjacent memory boards 104. Height dimension H is also shown in FIG. 1. Sufficient clearance between the memory boards 104 is necessary to insert and remove memory boards 104 without interfering with adjacent boards.

FIG. 1 shows DRAM SIMMs 110 plugged into slots 108 on memory boards 104. The memory boards 104 are then plugged into the memory board slots 106 on the backplane 102. In this configuration, the top edge of the SIMMs 110 must clear the bottom of the adjacent memory board 104. Height dimension H ranges between about 1.125 and 1.375 inches high, measuring from the bottom edge of connector 404 to a top edge of printed circuit board 902 of the SIMM 110. A preferred height is about 1.25 inches.

The size of the SIMM 110 of the present invention is also defined by a thickness dimension "T", as shown in the end view of FIG. 9B. Thickness dimension T ranges between about 0.25 and 0.35 inches. This dimension is defined by the SIMM-to-SIMM spacing on the memory board 104, as shown in FIG. 5. The maximum thickness T is about 0.35 inches to permit a 0.05 inch air gap between adjacent DRAM chips on adjacent SIMMs 110 for cooling, assuming a SIMM-to-SIMM slot 108 spacing of about 0.4 inches from center to center.

The height (H) and thickness (T) dimensions are more critical that the length (L) dimension, because the portion of the printed circuit board 902 above the connector 404 can actually extend beyond the ends of the connector 404. Apart from the fact that the SIMM 110 must be plug compatible with the 200-pin (pad) connector 404, there are no minimum height (H), length (L) and thickness (T) dimensions.

The address and control signals are fed to the SIMM 110 via a group of pins (pads) in a center region 912 of connector 404. The buffers (530 and 532 on the front side of the printed circuit board 902, and 534 and 536 on the back side of the printed circuit board 902) are positioned in the center of the PC board 902 to avoid degradation of address and control signals by minimizing the distance those signals must travel to the region 912. The buffers 530-536 also ease the burden of drivers on the main memory board for driving the address and control loads on the SIMM. Positioning of the buffers 412 in the center of the PC board also provides sharing of common PC board traces between buffers on both the front and the back of the SIMM to minimize pin usage.

As discussed above, a complete listing of the pin (pad) assignments is in Table 3 shown above.

A preferred, commercially available chip for buffers 530-536 is a 16-bit BICMOS chip, Part No. 74ABT16244DL, manufactured by Texas Instruments Incorporated, Dallas, Tex., U.S.A. to The layout of the DRAMs shown in FIG. 9A provides maximum SIMM data storage capacity for the dimensions disclosed above. This layout technique also provides sharing of common PC board traces between DRAMs on and between the front and the back surfaces of the printed circuit board 902. The PC board 902 must have multiple interconnect layers to provide a sufficient number of connections between the PC board connector pins and the DRAM and buffer chips and between the DRAM chips and the buffer chips.

All DRAM and buffer chips are preferably surface mount SOJ or TSOP type chips.

Surface mount bypass capacitors should be provided for the DRAM and buffer chips, as would be apparent to a person skilled in the relevant art.

VI. Dual Power Supply Capability

The pins (pads) of connector 904 are arranged to provide the SIMM 110 with dual power supply capability. Pins are provided for connection to 3.3 and 5 volt DC power supplies. This permits the SIMM 110 to be stuffed with DRAM and buffer chips having either 3.3 or 5 volt power supply requirements. The power supply pins are arranged symmetrically, as described above with respect to Table 3 and FIGS. 8A-8D. Even when the SIMM 110 is inserted incorrectly into slot 108, short circuits due to the dual power supply capability are avoided by the symmetrical pin (pad) assignment. As noted above, the SIMM 110 cannot be fully inserted backwards into slot 108 because of the positioning of the alignment notch 906 and the extraction notch 908.

A good description of the mixing of 3-V and 5-V power supplies in computer systems is found in an article titled, "Mixing of 3-V and 5-V ICs", by John Williams (*IEEE Spectrum*, March 1993, Vol. 30, No. 3, pp.40-42), which is incorporated herein by reference.

VII. Conclusion

The present invention allows the user to configure the main memory of the computer using SIMMs 110 which can be plugged into (connected) to the memory board 104. Any suitable arrangement of SIMMs 110 can be used on the memory board 104 to achieve the desired memory capacity and performance characteristics.

In addition, one or more memory boards 104 (with associated SIMMs 110) can be plugged into (connected) to the backplane 102. This arrangement results in the desired memory configuration for the main memory for the computer system.

The performance of the SIMMs 110 is enhanced because the present invention utilizes multiple buffer chips 530-536 for controlling the DRAMs of the SIMMs 110. Moreover, the arrangement of the components of the SIMMs 110, including the DRAM chips, buses, and connectors along with the buffers 530-536, minimize the capacitance effect caused by the driving of the DRAMs. This minimization of the capacitance effects for addressing and control of the DRAMs increases performance including speed of the read and write cycles. The use of these multiple buffers 530-536 also allows for uses of different types of SIMMs 110 to be used in a single system (on a memory board-by-memory board basis).

Furthermore, a piggy-back configuration for high storage capacity can use low profile DRAM chips mounted on both sides of two printed circuit boards which are sandwiched together, and still meet the physical dimension requirements and plug compatibility of the slots 108 for the single printed circuit board SIMMs.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents. All cited patent documents and publications in the above description are incorporated herein by reference.

What is claimed is:

1. A single in-line memory module (SIMM) adapted for use with a computer memory board, which SIMM comprises:
   (a) a printed circuit board having a connector with 200 connector pads, including
      a first group of control and address pads,
      a second group of data input/output pads,
      a third group of type code pads, and
      a fourth group of power pads;
   (b) at least two dynamic random access memory (DRAM) sets capable of storing wide data words, each set having at least one dynamic random access memory (DRAM) chip, wherein said DRAM chips are mounted on said printed circuit board, and each said DRAM chip has a first group of control and address leads and a second group of data input/output leads;
   (c) a plurality of buffers equal to the number of said DRAM sets and mounted on said printed circuit board, each buffer having input leads and output leads, wherein said buffers buffer control and address signals for said DRAM chips; and
   (d) means for connecting
      said output leads of said buffers to said first group of leads,
      said first group of pads to said input leads of said buffers, and
      said second group of pads to said second group of leads.

2. The SIMM of claim 1, wherein said third group of type code pads comprises three pads capable of specifying 8 specific type codes.

3. The SIMM of claim 2, further comprising means for biasing said three type code pads so that the SIMM provides type coding signals which indicate a specific type code to the memory board, wherein each specific code specifies a total memory capacity and a depth format of the SIMM.

4. The SIMM of claim 3, wherein:
said connector has 100 odd numbered pads on a front side of said printed circuit board and 100 even numbered pads on a back side of said printed circuit board; and
said three type code pads are T0, T1 and T2 and have pad assignment locations 91, 92 and 110, respectively.

5. The SIMM of claim 4, wherein said pad T0 is biased to logic low, said pad T1 is biased to logic low, and said pad T2 is biased to logic low to produce a type code corresponding to a total memory capacity of 4M bytes and a depth format of 256K total storage locations on the SIMM.

6. The SIMM of claim 4, wherein said pad T0 is biased to logic high, said pad T1 is biased to logic low, and said pad T2 is biased to logic low to produce a type code corresponding to a total memory capacity of 16M bytes and a depth format of 1M total storage locations on the SIMM.

7. The SIMM of claim 4, wherein said pad T0 is biased to logic low, said pad T1 is biased to logic low, and said pad T2 is biased to logic low to produce a type code corresponding to a total memory capacity of 16M bytes and a depth format of 2M total storage locations on the SIMM.

8. The SIMM of claim 4, wherein said pad T0 is biased to logic high, said pad T1 is biased to logic high, and said pad T2 is biased to logic low to produce a type code corresponding to a total memory capacity of 64M bytes and a depth format of 4M total storage locations on the SIMM.

9. The SIMM of claim 4, wherein said pad T0 is biased to logic low, said pad T1 is biased to logic low, and said pad T2 is biased to logic high to produce a type code corresponding to a total memory capacity of 64M bytes and a depth format of 4M total storage locations on the SIMM.

10. The SIMM of claim 4, wherein said pad T0 is biased to logic high, said pad T1 is biased to logic low, and said pad T2 is biased to logic low to produce a type code corresponding to a total memory capacity of 64M bytes and a depth format of 16M total storage locations on the SIMM.

11. The SIMM of claim 4, wherein said pad T0 is biased to logic low, said pad T1 is biased to logic high, and said pad T2 is biased to logic high to produce a type code corresponding to a total memory capacity of 64M bytes and a depth format of 16M total storage locations on the SIMM.

12. The SIMM of claim 1, wherein said power pads comprise a set of 3.3 volt power pads and a set of 5 volt power pads thus providing the SIMM with dual supply power capability such that 3.3 volt DRAM chips or 5 volt DRAM chips can be used without reconfiguring said printed circuit board.

13. The SIMM of claim 12, wherein:
said connector has 100 odd numbered pads on a front side of said printed circuit board and 100 even numbered pads on a back side of said printed circuit board; and
said set of 3.3 volt power pads comprises pad assignment locations 11, 12, 31, 32, 61, 62, 139, 140, 169, 170, 189 and 190.

14. The SIMM of claim 12, wherein:
said connector has 100 odd numbered pads on a front side of said printed circuit board and 100 even numbered pads on a back side of said printed circuit board; and
said set of 5 volt power pads comprises pad assignment locations 21, 22, 51, 52, 71, 72, 129, 130, 149, 150, 179 and 180.

15. The SIMM of claim 1, wherein said power pads comprise a set of 3.3 volt power pads.

16. The SIMM of claim 15, wherein:
said connector has 100 odd numbered pads on a front side of said printed circuit board and 100 even numbered pads on a back side of said printed circuit board; and
said set of 3.3 volt power pads comprises pad assignment locations 11, 12, 31, 32, 61, 62, 139, 140, 169, 170, 189 and 190.

17. The SIMM of claim 1, wherein said power pads comprise a set of 5 volt power pads.

18. The SIMM of claim 17, wherein:
said connector has 100 odd numbered pads on a front side of said printed circuit board and 100 even numbered pads on a back side of said printed circuit board; and
said set of 5 volt power pads comprises pad assignment locations 21, 22, 51, 52, 71, 72, 129, 130, 149, 150, 179 and 180.

19. The SIMM of claim 1, wherein:
a first one of said plurality of buffers is located on a front center section of said printed circuit board;
a second one of said plurality of buffers is located on a back center section of said printed circuit board;
said control pads are located in a center section of said connector; and
said means for connecting said first group of pads to said input leads of said buffers comprises a control bus for mounting control signals a minimal distance from said center section of said connector to said front and back center sections of said printed circuit board.

20. The SIMM of claim 19, wherein:
said connector has 100 odd numbered pads on a front side of said printed circuit board and 100 even numbered pads on a back side of said printed circuit board; and
said control pads comprise a row access strobe (RAS) signal pad, a column access strobe (CAS) signal pad and a write enable (WE) signal pad having pad assignment locations 99, 100 and 101, respectively.

21. A single in-line memory module (SIMM) adapted for use with a computer memory board, which SIMM comprises:
(a) a printed circuit board having a connector with 200 connector pads, including
a first group of control and address pads,
a second group of data input/output pads,
a third group of type code pads, and
a fourth group of power pads;
(b) a dynamic random access memory (DRAM) set capable of storing wide data words, said DRAM set having a plurality of dynamic random access memory (DRAM) chips, wherein said DRAM chips are mounted on said printed circuit board, and each DRAM chip has a first group of control and address leads and a second group of data input/output leads;

(c) a buffer mounted on said printed circuit board, said buffer having input leads and output leads, wherein said buffer buffers control and address signals for said DRAM chips; and (d) means for connecting
said output leads of said buffer to said first group of leads,
said first group of pads to said input leads of said buffer, wherein said means for connecting said first group of pads to said input leads of said buffers comprises a control bus and an address bus, and
said second group of pads to said second group of leads, wherein said means for connecting said second group of pads to said second group of leads comprises a plurality of data buses.

22. The SIMM of claim 21, wherein said control bus and said address bus are located substantially on front and back center sections of said printed circuit board and each data bus of said plurality of data buses is connected to only one of said DRAM chips.

23. The SIMM of claim 22, wherein each data bus is 4 bits wide.

24. The SIMM of claim 22, wherein each data bus is 9 bits wide.

25. The SIMM of claim 22, wherein each data bus is 18 bits wide.

26. A single in-line memory module (SIMM) adapted for use with a computer memory board, which SIMM comprises:

(a) a printed circuit board having a connector with 200 connector pads, including
a first group of control and address pads,
a second group of data input/output pads,
a third group of type code pads, and
a fourth group of power pads;

(b) a plurality of dynamic random access memory (DRAM) sets capable of storing wide data words, each DRAM set comprising nine dynamic random access memory (DRAM) chips, said DRAM chips being mounted on said printed circuit board, and each DRAM chip has a first group of control and address leads and a second group of data input/output leads;

(c) a plurality of buffers equal to the number of said DRAM sets and mounted on said printed circuit board, each buffer having input leads and output leads, wherein said buffers buffer control and address signals for said DRAM chips; and (d) means for connecting
said output leads of said buffers to said first group of leads,
said first group of pads to said input leads of said buffers, and
said second group of pads to said second group of leads.

27. The SIMM of claim 26, wherein the SIMM comprises first through fourth DRAM sets and first through fourth buffers.

28. The SIMM of claim 27, wherein:
said printed circuit board comprises first and second sides;

said first and second DRAM sets and said first and second buffers are located on said first side of said board; and
said third and fourth DRAM sets and said third and fourth buffers are located on said second side of said board.

29. The SIMM of claim 28, wherein said first and second buffers are located between said first and second DRAM sets and said third and fourth buffers are located between said third and fourth DRAM sets.

30. The SIMM of claim 29, wherein said DRAM chips comprise 256k deep by 4-bit wide DRAMs to provide the SIMM with a storage capacity of 4M bytes.

31. The SIMM of claim 30, wherein said board has a height of substantially between 1.125 and 1.375 inches, measuring from a bottom edge to a top edge, and a length of substantially between 5.5 and 5.75 inches.

32. The SIMM of claim 31, wherein said height is substantially 1.25 inches and said length is substantially 5.625 inches.

33. The SIMM of claim 32, wherein said board has a thickness of substantially between 0.25 and 0.35 inches.

34. The SIMM of claim 29, wherein said DRAM chips comprise 1M deep by 4-bit wide DRAMs to provide the SIMM with a storage capacity of 16M bytes.

35. The SIMM of claim 34, wherein said board has a height of substantially between 1.125 and 1.375 inches, measuring from a bottom edge to a top edge, and a length of substantially between 5.5 and 5.75 inches.

36. The SIMM of claim 35, wherein said height is substantially 1.25 inches and said length is substantially 5.625 inches.

37. The SIMM of claim 36, wherein said board has a thickness of substantially between 0.25 and 0.35 inches.

38. The SIMM of claim 29, wherein 100 pads are located on said first side of said printed circuit board and 100 pads are located on said second side of said printed circuit board.

39. A computer memory board adapted for use with, and for insertion into a computer system backplane, which comprises:

(a) a main printed circuit board having a connector for connecting the computer memory board to the backplane;

(b) a first dynamic random access memory (DRAM) array leaf comprising first through fourth banks of single in-line memory module slots;

(c) a second DRAM array leaf comprising fifth through eighth banks of single in-line memory module slots;

wherein each of said banks comprises four single in-line memory module slots and each single in-line memory module slot is adapted to accommodate a single in-line memory module (SIMM), each SIMM comprising (i) a SIMM printed circuit board having a connector with 200 connector pads, including
(1) a first group of control and address pads,
(2) a second group of data input/output pads,
(3) a third group of type code pads, and
(4) a fourth group of power pads, (ii) at least two dynamic random access memory (DRAM) sets capable of storing wide data words, each DRAM set having at least one dynamic random access memory (DRAM) chip, wherein said DRAM chips are mounted on said printed circuit board, and each said DRAM chips has a first group of control and address leads and a second group of data input/output leads, (iii) a plurality of buffers equal to the number of said DRAM sets and mounted on said printed circuit board, each buffer having input leads and output leads, wherein said buffers buffer control and address signals for said DRAM chips, and (iv) means for connecting
(1) said output leads of said buffers to said first group of leads,
(2) said first group of pads to said input leads of said buffers, and
(3) said second group of pads to said second group of leads;

(d) a memory controller, electrically coupled to said SIMM slots, for providing address and control signals for said SIMMs; and (e) a data controller, electrically coupled to said SIMM slots and said memory controller, for controlling the flow of data to and from said SIMMs.

40. The computer memory board of claim 39, wherein said data controller comprises first through fourth data controller chips, wherein said first and second data controller chips are adapted to control the flow of data to and from said first DRAM array leaf and said third and fourth data controller chips are adapted to control the flow of data to and from said second DRAM array leaf.

41. The computer memory board of claim 39, wherein each SIMM stores 144-bit wide data words, and each bank four SIMMs stores 576-bit wide data words.

42. The computer memory board of claim 41, wherein said memory controller comprises means for performing only two column accesses per each row access strobe (RAS) to provide a shorter cycle time and increased memory bandwidth.

43. The computer memory board of claim 42, wherein said memory controller further comprises means for early turn off of the RAS in order to precharge for a next RAS.

44. A single in-line memory module (SIMM) adapted for use with a computer memory board, which SIMM comprises:

(a) a printed circuit board having a connector with 100 odd numbered pads on a front side of said printed circuit board and 100 even numbered pads on a back side of said printed circuit board, said connector including
a first group of control and address pads,
said control pads comprising a row access strobe (RAS) signal pad, a column access strobe (CAS) signal pad and a write enable (WE) signal pad having pad assignment locations 99, 100 and 101, respectively, and
said address pads having pad assignment locations 93 through 98 and 103 through 109,
a second group of 144 data input/output pads, said data input/output pads being grouped into 36 4-bit wide buses forming a pattern of 2 adjacent 4-bit wide buses separated by 2 pad assignment locations,
a third group of type code pads, said type code pads comprising three pads capable of specifying up to 8 specific type codes, said specific type codes specifying a total memory capacity and a depth format of the SIMM, and said three type code pads having pad assignment locations 91, 92 and 110, respectively, and
a fourth group of one or more 3.3 volt power pads having pad assignment locations 11, 12, 31, 32, 61, 62, 139, 140, 169, 170, 189 and 190;

(b) at least one dynamic random access memory (DRAM) set capable of storing wide data words, said at least one DRAM set having a plurality of dynamic random access memory (DRAM) chips, wherein said DRAM chips are mounted on said printed circuit board, and each DRAM chip has a first group of control and address leads and a second group of data input/output leads;

(c) at least one buffer mounted on said printed circuit board, said buffer having input leads and output leads, wherein said buffer buffers control and address signals for said plurality of DRAM chips;

(d) means for connecting
said output leads of said buffers to said first group of leads,
said first group of pads to said input leads of said buffers, and
said second group of pads to said second group of leads; and (e) means for biasing said three type code pads so that the SIMM provides type coding signals which indicate a specific type code to the memory board.

45. The SIMM of claim 44, wherein said 36 4-bit wide buses have pad assignment locations 3-6, 7-10, 13-16, 17-20, 23-26, 27-30, 33-36, 37-40, 43-46, 47-50, 53-56, 57-60, 63-66, 67-70, 73-76, 77-80, 83-86, 87-90, 111-114, 115-118, 121-124, 125-128, 131-134, 135-138, 141-144, 145-148, 151-154, 155-158, 161-164, 165-168, 171-174, 175-178, 181-184, 185-188, 191-194, and 195-198, respectively.

46. A single in-line memory module (SIMM) adapted for use with a computer memory board, which SIMM comprises:

(a) a printed circuit board having a connector with 100 odd numbered pads on a front side of said printed circuit board and 100 even numbered pads on a back side of said printed circuit board, said connector including
a first group of control and address pads,
said control pads comprising a row access strobe (RAS) signal pad, a column access strobe (CAS) signal pad and a write enable (WE) signal pad having pad assignment locations 99, 100 and 101, respectively, and
said address pads having pad assignment locations 93 through 98 and 103 through 109,
a second group of 144 data input/output pads, said data input/output pads being grouped into 36 4-bit wide buses forming a pattern of 2 adjacent 4-bit wide buses separated by 2 pad assignment locations,
a third group of type code pads, said type code pads comprising three pads capable of specifying up to 8 specific type codes, said specific type codes specifying a total memory capacity and a depth format of the SIMM, and said three type code pads having pad assignment locations 91, 92 and 110, respectively, and
a fourth group of one or more 5 volt power pads having pad assignment locations 21, 22, 51, 52, 71, 72, 129, 130, 149, 150, 179 and 180;

(b) at least one dynamic random access memory (DRAM) set capable of storing wide data words, said at least one DRAM set having a plurality of dynamic random access memory (DRAM) chips, wherein said DRAM chips are mounted on said printed circuit board, and said DRAM chip has a first group of control and address leads and a second group of data input/output leads;

(c) at least one buffer mounted on said printed circuit board, said buffer having input leads and output leads, wherein said buffer buffers control and address signals for said plurality of DRAM chips;

(d) means for connecting said output leads of said buffers to said first group of leads, said first group of pads to said input leads of said buffers, and said second group of pads to said second group of leads; and (e) means for biasing said three type code pads so that the SIMM provides type coding signals which indicate a specific type code to the memory board.

47. The SIMM of claim 46, wherein said 36 4-bit wide buses have pad assignment locations 3-6, 7-10, 13-16, 17-20, 23-26, 27-30, 33-36, 37-40, 43-46, 47-50, 53-56, 57-60, 63-66, 67-70, 73-76, 77-80, 83-86, 87-90, 111-114, 115-118, 121-124, 125-128, 131-134, 135-138, 141-144, 145-148, 151-154, 155-158, 161-164, 165-168, 171-174, 175-178, 181-184, 185-188, 191-194, and 195-198, respectively.

* * * * *